(12) United States Patent
Hirai et al.

(10) Patent No.: US 6,517,362 B2
(45) Date of Patent: Feb. 11, 2003

(54) SPIRAL CONTACTOR, SEMICONDUCTOR DEVICE INSPECTING APPARATUS AND ELECTRONIC PART USING SAME, AND METHOD OF MANUFACTURING THE SAME

(75) Inventors: Yukihiro Hirai, c/o Advanced Systems Japan, 1-7-21 Maebaracho, Koganei-shi, Tokyo 184-0013 (JP); Chihiro Ueda, Tokyo (JP); Kouichi Yoshida, Tokyo (JP)

(73) Assignee: Yukihiro Hirai, Tokyo (JP)

( * ) Notice: Subject to any disclaimer, the term of this patent is extended or adjusted under 35 U.S.C. 154(b) by 0 days.

(21) Appl. No.: 09/925,797

(22) Filed: Aug. 10, 2001

(65) Prior Publication Data

US 2002/0037657 A1 Mar. 28, 2002

(30) Foreign Application Priority Data

Sep. 26, 2000 (JP) ........................... 2000-292652
Mar. 19, 2001 (JP) ........................... 2001-077338

(51) Int. Cl.[7] ............................................. H01R 12/00
(52) U.S. Cl. ........................................... 439/82; 439/71
(58) Field of Search ........................... 439/82, 55, 68, 439/70, 71

(56) References Cited

U.S. PATENT DOCUMENTS

| | | | | | |
|---|---|---|---|---|---|
| 4,893,172 | A | * | 1/1990 | Matsumoto et al. | ........ 174/254 |
| 5,810,609 | A | * | 9/1998 | Faraci et al. | ........ 439/71 |
| 5,812,378 | A | * | 9/1998 | Fjelstad et al. | ........ 361/769 |
| 5,973,394 | A | * | 10/1999 | Slocum et al. | ........ 257/690 |

* cited by examiner

Primary Examiner—Tho D. Ta
Assistant Examiner—Ann McCamey
(74) Attorney, Agent, or Firm—Liniak, Berenato & White

(57) ABSTRACT

A spiral contactor for establishing an electric connection with a semiconductor device or an electronic part including a solder ball includes a spiral probe having a spiral shape as viewed from a top thereof. The spiral probe is embedded in an insulating substrate in a manner that permits resilient deformation thereof in accordance with a shape of the solder ball, and an edge of the spiral probe is pressed to engage into the solder ball and slides along a periphery of the solder ball, thereby cutting oxide membrane thereon. The spiral contactor may be manufactured by combination of the photolithography technique and the plating process, and used for a semiconductor inspecting apparatus and an electronic part.

15 Claims, 32 Drawing Sheets

FIG.18
(a) In case of desorbing a semiconductor device
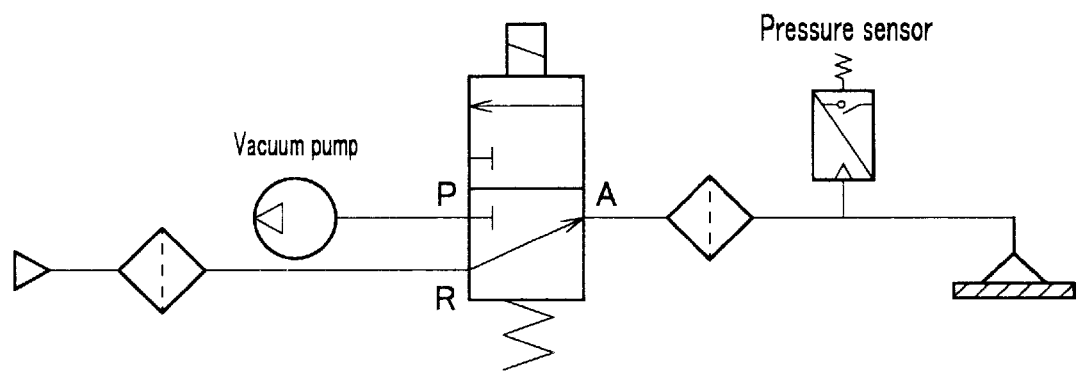
(b) In case of adsorbing a semiconductor device
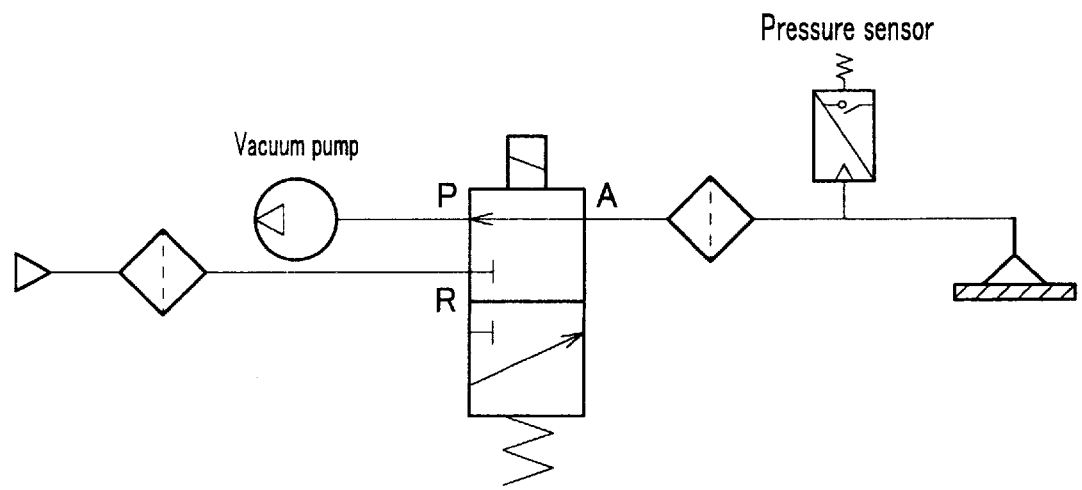

FIG.33
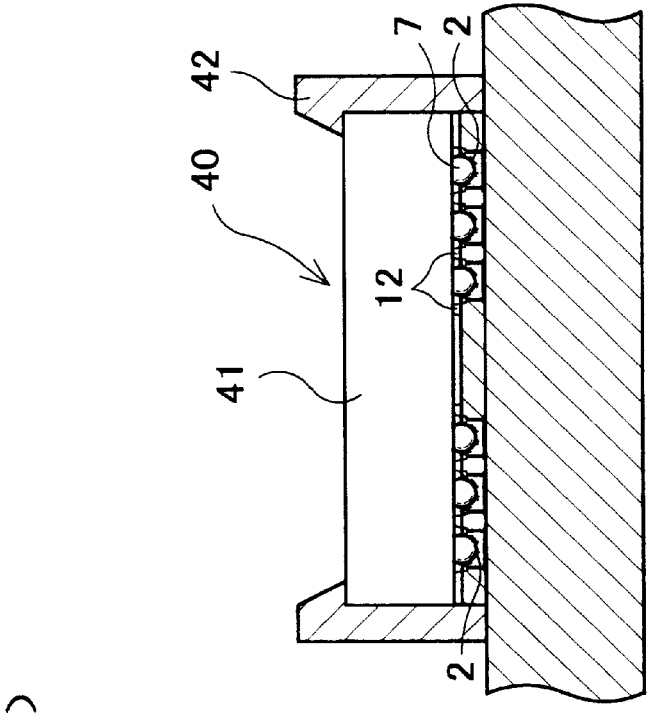
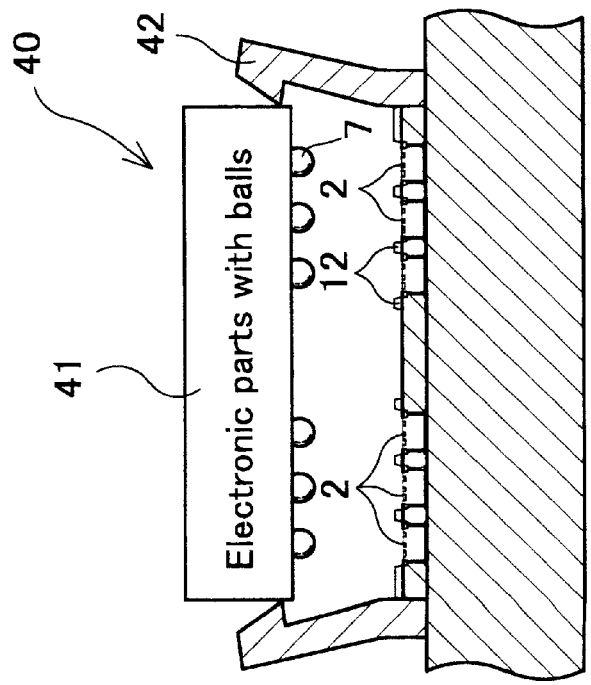

FIG. 34
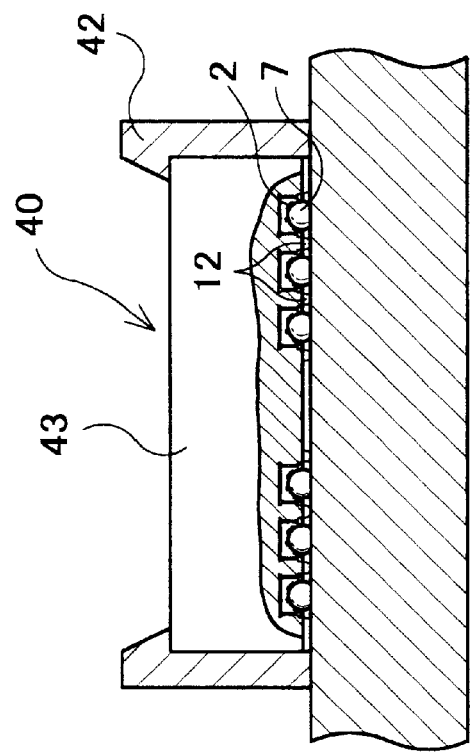
(a)
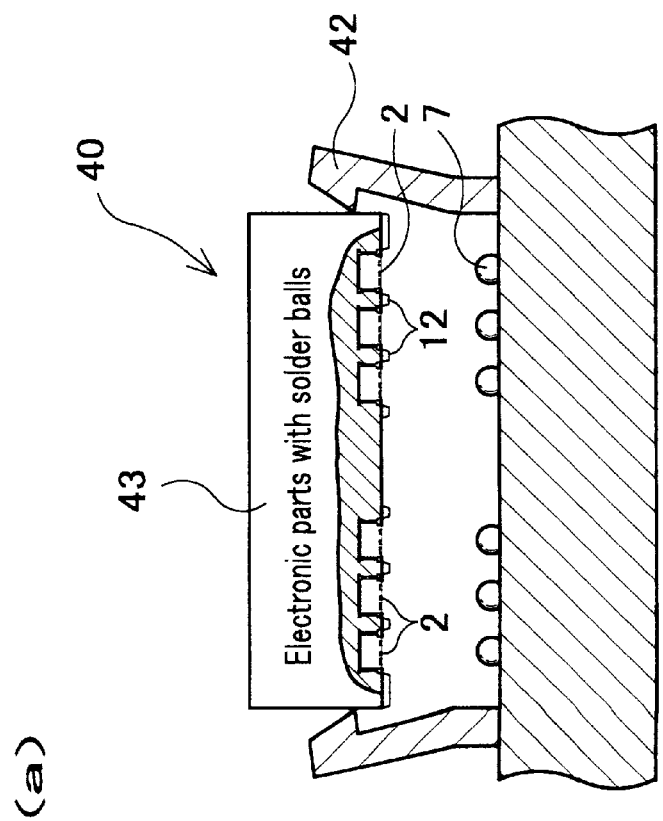
(b)

SPIRAL CONTACTOR, SEMICONDUCTOR DEVICE INSPECTING APPARATUS AND ELECTRONIC PART USING SAME, AND METHOD OF MANUFACTURING THE SAME

BACKGROUND OF THE INVENTION

2. Field of the Invention

This invention includes the concept of an electrical spiral contactor, the required semiconductor inspecting equipment and a solder-ball-contact semiconductor or other electronic device that makes a spherical-ball type of electrical connection.

2. Prior Art

Due to the increasing demand of greater density and the need to improve the high performance of semiconductor integrated circuits (IC), IC package (hereinafter called "a package" or "packages") equipped with one ore more IC chips (hereinafter called "a semiconductor device") this innovative idea allows for an even more advanced development stage in various ways. One such method includes increasing the number of pins (greater density) due to the miniaturization (thinning down) of the actual contact area. Using this new technique to increase the density of input and output terminals, packages with pin-counts as high as 1000 pins can be achieved. Consequently, this new method (due to it's reduced size) will also change the current lead line connection which is pulled from top and bottom or all quarters into a single bottom-only lead-line connection further reducing the total size of the package.

Thus if the complete bottom of a semiconductor device were lined with BGA (Ball Grid Array) contactors such that they would not be larger than the package itself, or a slightly different method CSP (Chip Size Package) which is a little larger than the actual semiconductor device itself, with the solder balls (instead of pins) aligned in a grid arrangement, the pitch interval can be reduced from 0.8 mm to 0.5 mm increasing density with the use of these solder balls.

Furthermore, solder probes are lighter, thinner and shorter than conventional probes allowing for further miniaturization and densification as well as improving electrical conductance, but to ensure such properties are adhered to, special inspection equipment specifically for such a new method is also required. Current semiconductor inspection equipment perform their electrical tests using a needle-like probe or a meter reader and physically contacting the outer electrode leads on semiconductor devices and passing an electrical current through each semiconductor device to measure it's electrical properties. This method of semiconductor inspection is commonly referred to as wafer probing and is currently used to measure and confirm whether semiconductor devices functions per specification or not. Numerous devices are all embedded in a grid-pattern on the surface of a wafer and currently use a probe card which can contain up to several hundred or more individual probe needles which are capable of measuring one or multiple devices simultaneously, but as the complete wafer cannot be measured all at once due to the size of probe cards and also due to the miniaturization limitations with current probe card technology, this measurement must be repeated over and over moving the stage which the wafer rests to allow complete testing of all devices on the entire wafer.

However, when using the thinned-down super miniaturization and reduction in pitch of solder probes, a new problem in the precision and reliability of current inspection equipment arises due to the densification of solder balls technology.

Thus, just as prior inspection equipment technology was limited by the physical development limitations of such inspection equipment for that type of semiconductor technology, this new technology requires a new type of inspection equipment as the older technology is insufficient as it doesn't support the densification which/solder balls require. Similarly, current measurement methods require contacting probe needles directly to the silicon leads which do cause damage to existing semiconductor devices sometimes damaging them or weakening their lifetime, but as solder balls are made of a softer metallic material, such hard contact with a probe needle will scratch the surface of the solder balls and or not make complete contact due to the spherical surface of the solder ball itself causing loss of the electrical properties thus rendering it outside of the specifications which it was originally designed to meet.

Therefore, the present invention is subject to provide a spiral contactor, semiconductor inspecting equipment (sockets, testing boards and probe cards) and electronic parts (mounting socket, mounting connector), these are capable for applying to miniature typed semiconductor device, package, super miniature bear chips and also wafer, for forming a current carry circuit without giving a defamation and a flaw on soft solder balls, for applying to densification of solder balls, and for carrying out a high reliable inspection by reasonable price.

SUMMARY OF THE INVENTION

As a method to solve said subject, a spiral contactor regarding to the present invention is a contactor to make an electric connection with as a semiconductor device or electric parts having solder balls, and said contactor is characterized as comprising a spiral probe seen as a spiral shape in top view which is deformable in response to the shape of this solder probe when contacting with said solder probe on an insulting substrate to make an electric connection with a said semiconductor device or electric parts.

A spiral probe regarding to the present invention is a flat shaped spiral in non-loading condition, however, when a solder ball of a semiconductor device or electrical parts pressed on a spiral probe, contact area is expanding into outside from center of a semiconductor probe, consequently a spiral portion is bent into concave to deform like embracing a ball. Compared with a point contact of conventional probe, a spiral probe can twine around a solder ball as screwing that causes a long and accurate contact as well as removing foreign matters by sliding action along a periphery of a solder probe even though there are adherence of foreign matters, consequently, a stable current-carrying contact can be secured that is highly reliable.

Besides, a spiral probe can get an accurate current-carrying since the corner of a spiral probe is sliding with being pressed to a periphery of solder ball and cut oxygen membrane on a periphery of a solder ball.

Furthermore, a spiral probe has a flexible compatibility with a variation in a diameter and sinking of solder balls due to twining. In addition, a spiral probe is flexibly acceptable for variation in positioning of vertical and horizontal direction of a solder probe.

According to the present invention, there is a spiral contactor wherein the insulting substrate is characterized as having said deformable structure by installing dents or through holes of bellow said spiral probes.

Said dents or through holes secure sufficient space under the condition that a sinking pressed by said solder ball does not affect the bends of said spiral probe.

According to the present invention, there is a spiral contactor further making said inner through hole as current-carry circuit of a vertical wiring method.

In the invention described, dispensing a copper plating to said inner-hole which is commonly called as through hole established in an insulating substrate to form a current-carry circuit by using this copper plating causes unnecessary parts for wiring on an insulating substrate. Furthermore allocating a spiral probe to an aperture can form a small space and efficient connecting circuit.

Applying to a densification of solder balls was difficult since a current-carry circuit by a conventional parallel wiring method required a space for connecting portion, wiring portion and so forth, however, for said vertical wiring method, applying to a densification of solder balls is easy due to a minimum space.

According to the present invention, there is a spiral contactor wherein one or a plurality of condensers are allocated to around said spiral probe, and said condenser is connected with said spiral probe.

In the present invention, as an electrical power supply source circuit, allocating a condenser (pascon) to around said spiral probe is efficiently useful for trouble shooting. Especially in power supply circuit to transact a rapid signal, when power reduction is occurred by a momentary consumption, this causes the situation which an electrical signal can not be accurately transmitted, however, this one become an efficient method to evade this situation, and momentarily applying to a voltage drop in a transacted circuit of rapid signal is practical. Besides as the method of allocating a condenser, penetrating through holes around a spiral probe into an insulating substrate to lay a condenser in said hole, or allocating a condenser to fix around a spiral probe can be acceptable.

According to the present invention, there is a spiral contactor wherein an elastic body or an elastic membrane is distributed to under said spiral probe.

Said elastic body or elastic membrane is the elastic body or membrane of a rubber, silicon, and a plastic system, and a gel system is also available, these purpose are to assist a spiral probe from below, to maintain an elastic force of a spiral probe and to secure an air tightness.

According to the present invention, there is a spiral contactor wherein a width of a spiral portion of said spiral probe has narrower one as approaching a top from a root. For example, like a fishing rod, the more approaching a top, the narrower a width is, this cause a bending stress to disperse. For restraining fracture, also a spiral probe is to restrain fracture by dispersing a bending stress through making more narrow width as approaching a top.

According to the present invention, there is a spiral contactor that comprises of establishing a guide-frame around said spiral probe allocated to said insulating substrate. In case of using as a socket or a probe card which is one of semiconductor devices, an accurate positioning of a solder ball for a spiral probe is required. As a guide function to make an adjustment of accurate positioning, dispensing a guide-frame can not only reduce a time to make an adjustment of positioning but also play a role of a stopper as restricting an indentation of a solder ball.

According to the present invention, there is a spiral contactor wherein a shape of said spiral probe allocated to said insulating substrate is subject to a convex.

Filling an elastic body into an established hole under said spiral probe and adding a dent on a connecting portion of back side of said insulating substrate makes the shape of a spiral probe a convex. A spiral contactor consists of this convex shaped spiral probe is efficient for contacting with a semiconductor having a flat shaped probe (bonding pad) different from a solder probe.

According to the present invention, there is a semiconductor inspection device by using a spiral contactor wherein loading a semiconductor device having solder balls as subject in a proper position of a semiconductor inspection device and equipping a sensor to detect a contact by a proper pressure.

Through a movement of the sensor imbedded in such as a socket of a semiconductor inspection device, it is possible to detect whether a semiconductor device is accurately loaded and contact by a proper pressure or not, consequently, these inventions allow setting the interval for gaining a contact by an appropriate pressure to practice for enhancing a work efficiency. Besides, though an optical proximity switch is used as a sensor, a substitute for this is available.

According to the present invention, there is a semiconductor inspection device with a spiral contactor having a sealant for adhering to said semiconductor device in an insulating substrate of a semiconductor inspection device.

Since an air tightness is secured by said sealant in an insulating substrate of a semiconductor inspection device and a contact can be maintained by a vacuum adsorption method to reduce a pressure by evacuating air in between said insulating substrate and said semiconductor device, the operation of attaching or detaching can be easily carried out.

A semiconductor inspection device regarding to the present invention may further comprise that a semiconductor device is loaded in an inspection device such as a socket or a probe card having a spiral probe, after positioning was over, reducing pressure in between a semiconductor device and a spiral probe cause a semiconductor device to be adsorbed into a spiral probe, furthermore, a solder ball of a semiconductor device presses and deforms a spiral probe in response to the shape of a solder ball for twining, consequently, an excellent current-carrying circuit in reliability of contact can be formed.

The method of this vacuum adsorption requires a hint of pressure reduction and causes both sides to be adsorbed with each other in a twinkle to practice well-balanced contact by a slight force as a whole.

A structurally simple shaped and reliable contactor can be formed. Moreover, a structure of an elastic membrane (shown in FIG. 14) has also a roll of a sealant for air tightness other than an auxiliary of a spiral probe.

According to the present invention, there is semiconductor inspection device using a spiral contactor that provides an air pressure detecting method to leases signals by detecting a decreasing air pressure which is yield by evacuating air in between an insulating substrate of said semiconductor inspection device and said semiconductor device.

As an air pressure detecting method of the present invention, a pressure sensor is appropriate. Since a sensor of an optical proximity switch is unnecessary due to the detection by pressure sensor, imbedding a sensor and electrical wiring are unnecessary, these cause a simplification on the insulating substrate.

According to the present invention, there is a semiconductor inspection device using a spiral contactor that comprises a method, in which a positioning of each semiconductor device and probe cards after dicing a wafer by a dicer is carried out under the condition of said dicing as it is.

As the inspection process using a conventional probe card, after carrying out an inspection at the stage of a wafer and dicing into individual chips for storing in a tray, one more inspection is carried out by a handler. The reason why double inspections are required in this way attributes to an occurrence of defects in dicing process. Therefore the present invention is to carry out an inspection only after dicing by omitting the stage of wafer to reduce from twice:inspection to once. The present invention is the probe card substitute to a conventional one.

According to the present invention, there is a semiconductor inspection device having said spiral contactor allocates a spiral contactor to both side of an insulating substrate.

A metal ball or a protruding spherical terminal having a function of "mail connector" which is one of electronic parts is set anytime on one side of the alternative contact to be connected. On the other side, a semiconductor device and so forth under inspections are loaded by turns to be inspected for an electronic characteristic.

According to of the present invention, there is electronic parts using said spiral contactor allocates a spiral contactor in one side or both side of an insulating substrate. The present invention may comprise a mounting socket or a mounting connector as electrical parts of another usage.

Now, Integrated circuit, condenser, resistor and so forth are densely mounted in an electrical circuit board of an electrical appliance represented a cellar phone which must be miniature, lightweight, tin typed and excellent in high frequency electric characteristic. Naturally, an electronic part to electrically connect with between two circuit boards is required to satisfy with dense and high frequency electric characteristic as well.

To improve a high frequency electric characteristic, the length for transmitting needs to be shortened, and a size reduction of socket portion and connector portion is efficient. By adopting a spiral contactor which is quite different from a conventional pin style, miniaturizing, lightening and thinning down in $\frac{1}{5}$ is practical, and a high frequency electric characteristics can be largely improved as well as simple and easy connecting, and consist of a small amount of parts.

According to the present invention, there are electronic parts using said spiral contactor providing a spiral contactor in at least one side edge of a connector cable. The present invention is that electric parts using a spiral contactor are connected with at least one side of a electric part connected with a connector cable.

The manufacturing method of a spiral contactor regarding to the invention is the method, in which a spiral contactor consists of a plurality of aligned spiral probe to electrically connect with a semiconductor device or electric parts having solder balls is formed on the surface of a print wiring board, and characterized as having following process.

A process of forming a metallic membrane on the whole surface of said insulating substrate by installing a hole.

A process of filling elastic elastomer into said hole to remove concave and convex of elastomer by surface processing.

A process of forming a metallic membrane on the area at least where an elastomer is exposed in said hole.

A process of forming a spiral probe shaped membrane by etching on the surface of metallic membrane formed on said insulating substrate, and of forming a circular shaped membrane by etching on the bellow surface.

A process of forming a spiral probe by etching on the surface of said insulating substrate.

A process of forming a different kind of metallic membrane on the surface of said insulating substrate.

A process of forming a resist membrane on the surface of said insulating substrate and of forming a guide-frame by cover-lay processing.

In this way, by the manufacturing method adopting a photolithography, a spiral contactor in which a plurality of spiral probe aligned sophisticatedly, densely and in fine pitch can be produced on the print wiring board.

Besides, a cover-lay processing is the meaning of printing off and developing a resist membrane, and a cover-lay processing and etching are called as a photolithography technology.

The manufacturing method of a spiral contactor may include a method, in which a spiral contactor consists of a plurality of aligned spiral probe to electrically connect with a semiconductor device or electric parts having solder balls is formed on the surface of a print wiring board, and characterized as having following process.

A process of forming a metallic membrane on the surface of a metallic plate to form a resist membrane on that surface.

A masking process of exposing, printing and developing a pattern of a spiral probe on said resist membrane.

A process of dispensing a metallic membrane to an exposed metallic portion in said process.

A process of removing said resists membrane.

A process of reforming said resists membrane.

A process of forming a guide-frame by exposing said spiral probe to print off and develop said resist membrane.

A process of removing a metallic membrane by etching after peeling and removing said metallic plate.

A tackling process of allocating each spiral probe in an aperture of each through holes installed in said print board to crimp after a conductive adhesive or a hander paste is painted.

As guide-frame can be formed by a resist membrane, even though a metallic plate is peeled, the shape can be sustained without falling into pieces, this leads an improvement of quality.

By a manufacturing method adopting a photolithography technology, a spiral contactor in which a plurality of spiral probe aligned sophisticatedly, densely and in fine pitch can be produced on the print wiring board having infinitesimal through hole.

The manufacturing method of a spiral contactor may include a method, in which a spiral contactor consists of a plurality of aligned spiral probe to electrically connect with a semiconductor device or electronic parts having solder balls is formed on the surface of a print wiring board, and characterized as having following process.

A masking process of forming a resist membrane on the surface of a metallic membrane formed on an insulating substrate, moreover, of printing and developing a shape of spiral probe.

A process of forming a different kind of metallic membrane in the metallic portion exposed by said masking process.

A process of removing said resists membrane.

A process of removing said resists metallic membrane by etching.

A process of forming said insulating substrate into a shape of a spiral probe by laser to reform a resist membrane on the surface.

A process of forming metallic membrane on the surface of said insulating substrate to remove a resist membrane by forming a different kind of metallic membrane on the surface.

A tackling process of painting a conductive adhesive or hander paste on the surface having through hole of said print board to allocate and crimp a spiral contactor in an aperture of through hole.

Irradiating an insulating substrate consists of a polyamide with lasers allows a metal portion to leave a present statue as it is and form into a shape of a spiral probe. Moreover, by the manufacturing method adopting a photolithography technology, a spiral contactor in which a plurality of spiral probe aligned sophisticatedly, densely and in fine pitch can be produced on the both side of a print wiring board having through hall.

The manufacturing method of a spiral contactor may include a method, in which a spiral contactor consists of a plurality of aligned spiral probe to electrically connect with a semiconductor device or electric parts having solder balls is formed on the surface of a print wiring board, and characterized as having following process.

A process of forming a metallic membrane on the surface of a metallic membrane formed on that membrane on the surface of insulating substrate, furthermore, after forming a resist membrane, printing off and developing this membrane to form a shape of a spiral probe on said resist membrane.

A process of removing a metallic membrane by etching with leaving a shape of said spiral probe.

A process of removing said insulating substrate by lasers.

A process of reforming a resist membrane on the surface of said insulating substrate to reform a different kind of metallic membrane after forming a metallic membrane.

A process of reforming a metallic membrane by etching after removing said resists membrane.

In this way, even though a manufacturing method of not using a conductive adhesive or a hander paste, adopting a photolithography technology causes a spiral contactor in which a plurality of spiral probe aligned sophisticatedly, densely and in fine pitch to be produced on an insulating substrate having through holes.

The manufacturing method of a spiral contactor may include a method, in which a spiral contactor consists of a plurality of aligned spiral probe to electrically connect with a semiconductor device or electric parts having solder balls is formed on the surface of a print wiring board having a micro-via hole, and characterized as having following process.

A process of forming a metallic membrane on the surface of metallic plate to form a resist membrane on that metallic membrane.

A masking processes of exposing, printing off and developing a pattern of a spiral probe in said resist membrane.

A process of dispensing a metallic membrane in a metallic portion exposed in said process.

A process of removing said resist membrane.

A process of reforming said resists membrane.

A process of exposing said spiral probe, and printing off and developing said resist membrane.

A process of removing a metallic membrane by etching after peeling and removing said metallic plate.

A tackling process of painting a conductive adhesive or hander paste around an aperture of micro-via hole on the surface of said print wiring board to allocate and crimp a spiral probe to a position of micro-via hole.

In this way, by the manufacturing method adopting a photolithography technology, even though a print wiring board having a micro-via hole, a spiral contactor in which a plurality of spiral probe aligned sophisticatedly, densely and in fine pitch can be produced.

BRIEF DESCRIPTION OF THE DRAWINGS

FIG. 18 illustrates a diagram of a pneumatic circuit of a semiconductor device having a spiral contactor regarding to the 11th embodiment of the present invention.

FIG. 33(a) is a type section to indicate the situation of mounting electronic parts in a socket, and (b) is a type section to indicate the situation that electronic parts were mounted in a socket.

FIG. 34(a) is a type section to indicate the situation of mounting electronic parts in socket, and (b) is a type section to indicate the situation that electronic parts were mounted in a socket.

DESCRIPTION OF THE PREFERRED EMBODIMENTS

Following is an explanation for embodiment of the invention with referencing drawings.

Figure 1:
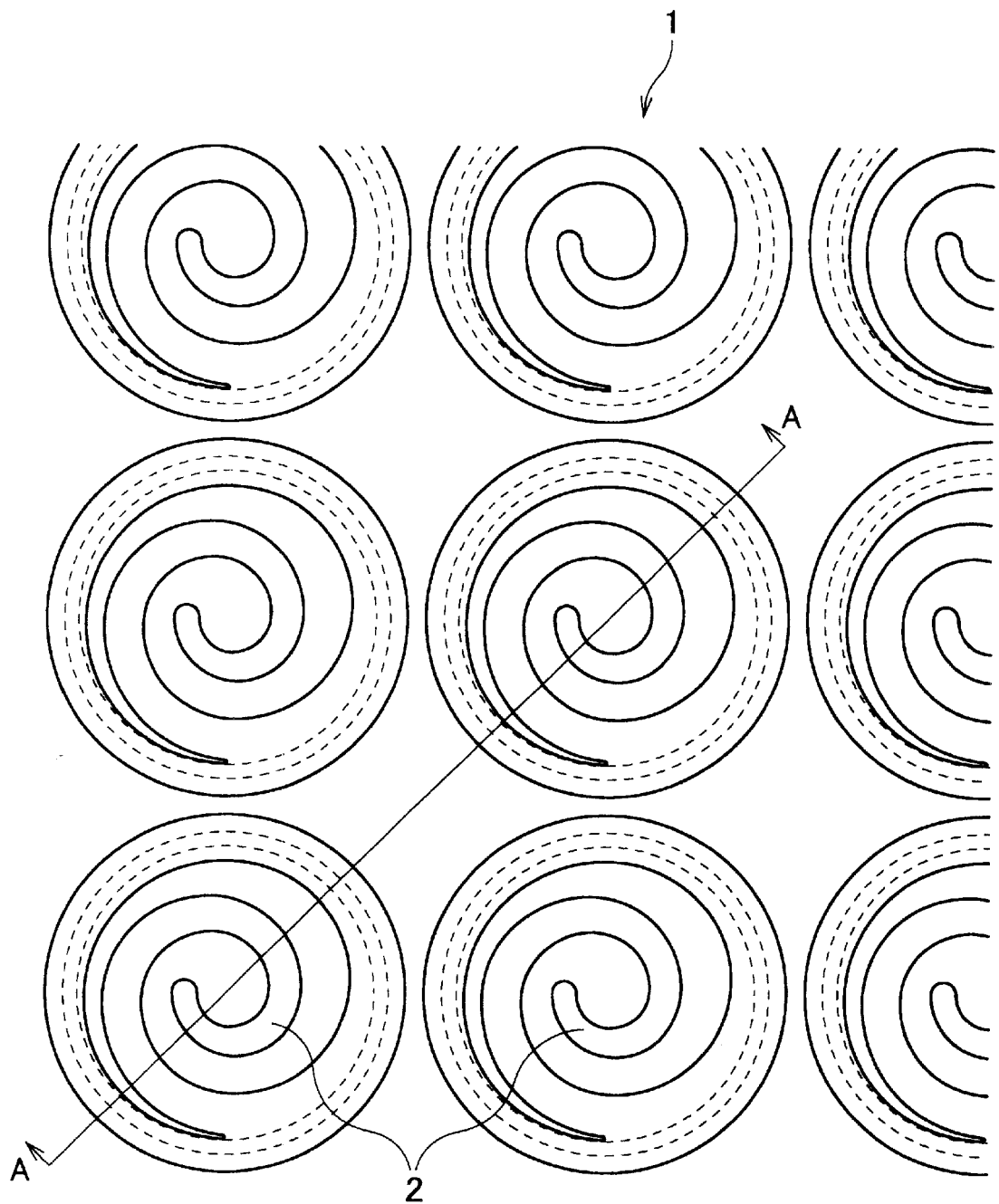
FIG. 1 illustrates a top view of a spiral contactor regarding to the first embodiment of the present invention.
Figure 2:
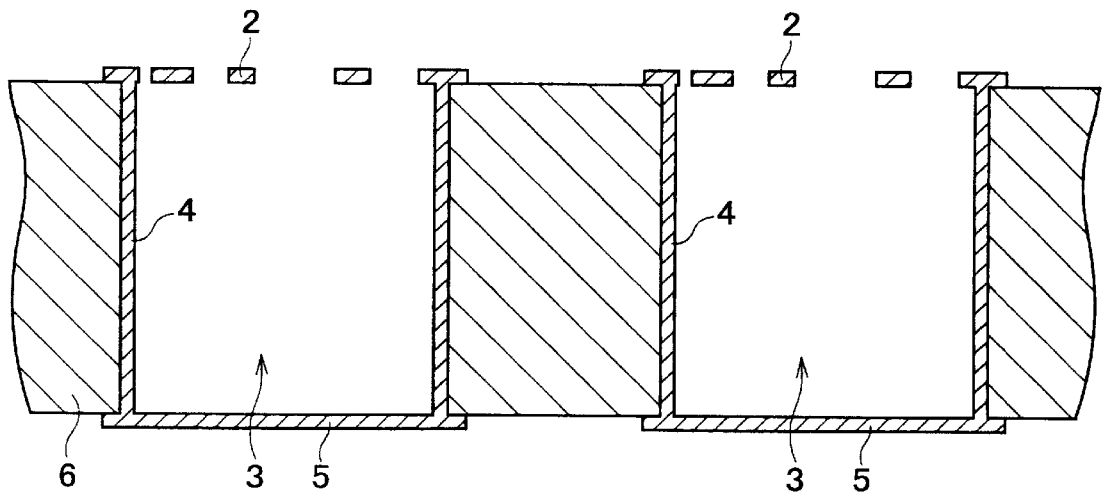
FIG. 2 illustrates A—A cross sectional view of FIG. 1 regarding to the first, second and third embodiment of the present invention.

FIG. 1 is a top view of a spiral contactor 1 to explain the first embodiment of the present invention, and FIG. 2 is A—A cross sectional view of FIG. 2.

In FIG. 1, the interval of solder balls indicating in the views is aligned with 0.4 mm pitches. A spiral contactor 1 consists of a plurality of spiral probes 2 allocated to the backside of a semiconductor devices in accordance with a solder probe allocated in grid arrangement, though a periphery of individual spiral probe 2 is subject to a circular shape, the inner side is a spiral shaped probe.

Besides, according to a spiral contactor 1 of the present invention, even the interval of a solder ball with smaller pitch can be compatible.

Figure 3:
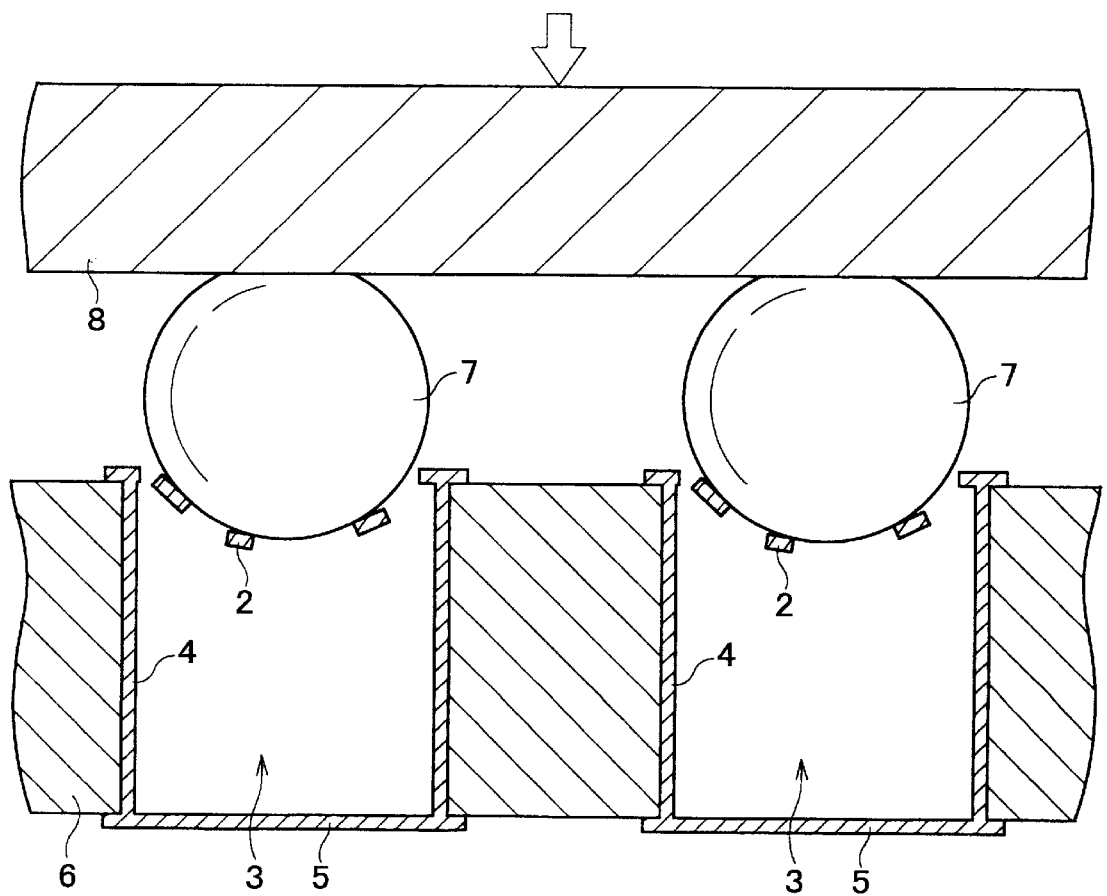
FIG. 3 illustrates A—A cross sectional view to indicate the situation of contacting with a semiconductor device.

In FIG. 2, a spiral probe 2 is a flat type spiral in non-loading condition. FIG. 3 is a cross sectional view to indicate the situation that a solder ball 7 of a semiconductor device 8 under inspection is contacted with a spiral probe 2.

When a solder ball 7 of a semiconductor device 8, pressed on a spiral prove 2, contact area is expanding into outside from center of a semiconductor probe 2, consequently a spiral portion is bent into concave to deform like embracing a ball. A spiral probe 2 can twine around a solder ball 7 as screwing that causes a long and accurate contact as well as removing foreign matters by sliding action along a periphery of a solder probe 7 even though there are adherence of foreign matters, consequently, a stable current-carrying contact can be secured.

Besides, A spiral probe 2 can get an accurate current-carrying since the corner 2a of a spiral probe is sliding with being pressed to a periphery of solder ball 7 and cut oxygen membrane on a periphery of a solder ball 7.

Moreover, compared with conventional pressure which is 5~15 g for one probe, a pressure of the present invention for one probe is 0.8~1.5 g which can get a stable current-carrying contact by approximately $\frac{1}{10}$ of conventional pressure.

For example, in case of having 1000 probes in a conventional device, a pressure needs 10 kg, meanwhile a pressure of device adopting a spiral probe of the present invention requires only 1 kg, which is practical for a design of lighter weight structure.

Though a manufacturing method of a spiral probe 2 is going to mention in an embodied example, in order to carry out by a photograph printing technology (lithography) using a light or an electrical beam, fine machining is practical, however, a laser beam machining or other fine machining is also available.

FIG. 2, FIG. 3 is a drawing to explain the second embodiment of the present invention. Since a below hole 3 of a spiral probe 2 is cavity and space, a pressure of a solder probe 7 can cause a spiral probe 2 to deform. In other words, like FIG. 2, FIG. 3, a spiral probe 2 can be allocated to an aperture of an established penetrating hole commonly called as through hole.

FIG. 2 is a drawing to explain the third embodied of the present invention. In FIG. 2, for example, an insulating substrate 6 under a spiral probe 2 has a hole 3 of 0.3 mm in inner diameter. Dispensing a copper plating 4 into an inner hole 3 and forming a conductive portion allows a spiral probe 2 and a connecting portion 5 to directly connect each other, and to be a vertical wiring system current-carrying circuit.

Figure 4:
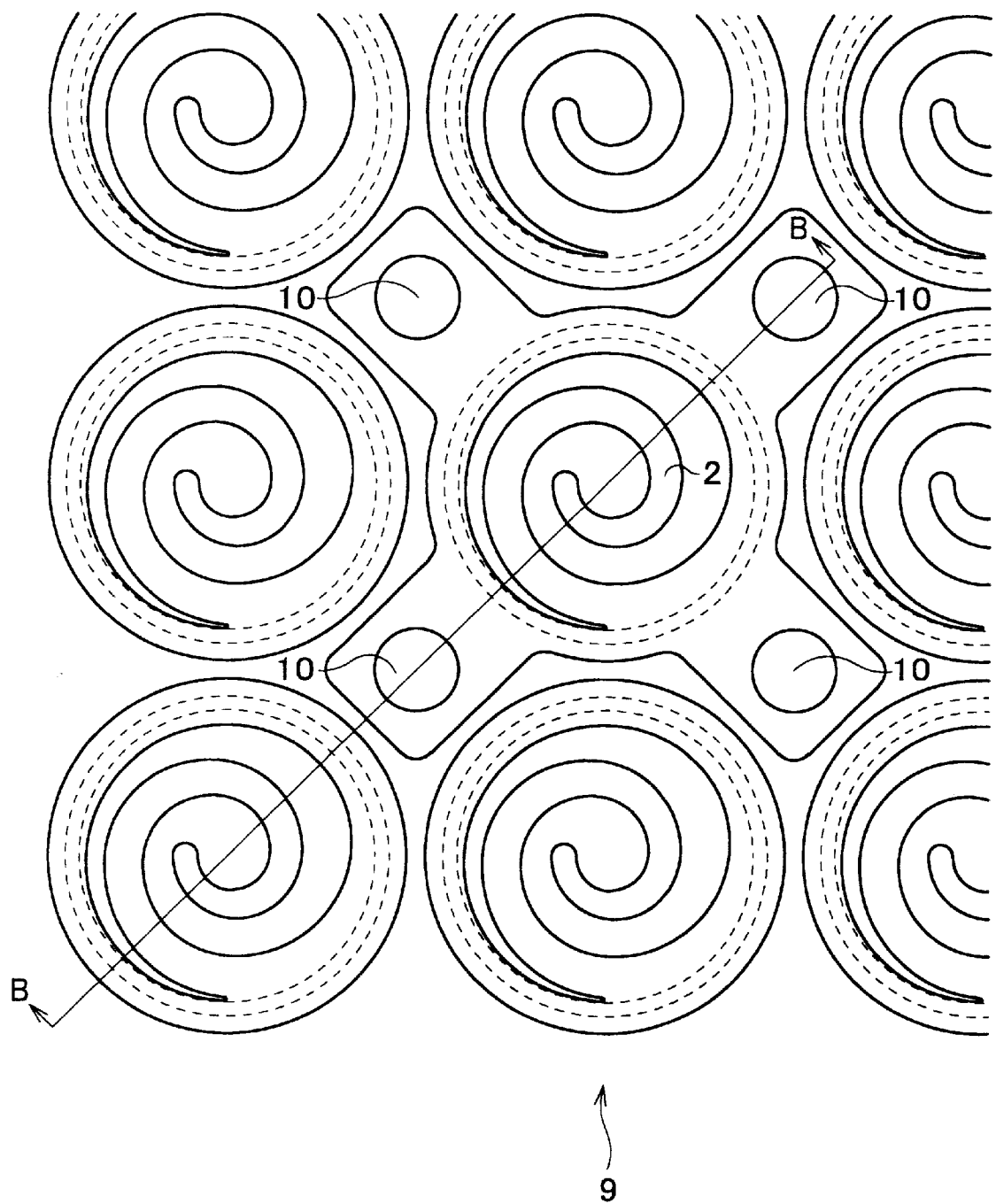
FIG. 4 illustrates a top view of allocating a condenser to around a spiral contactor regarding to the 4th embodiment of the present invention.
Figure 5:
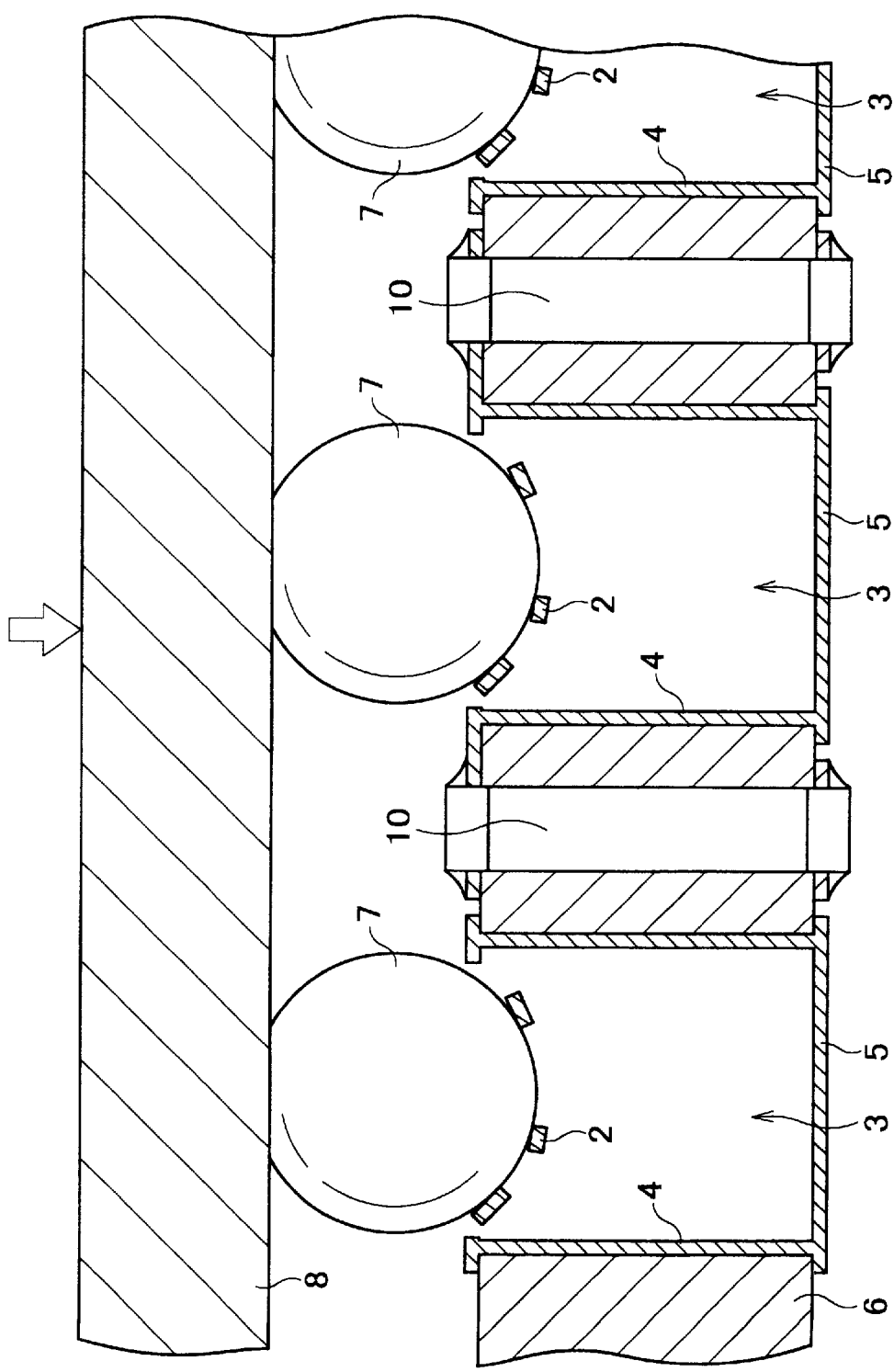
FIG. 5 illustrates B—B cross sectional view of FIG. 4 of a spiral contactor regarding to the 4th embodiment of the present invention.

FIG. 4, FIG. 5 is a drawing to explain the 4th embodiment of the present invention. FIG. 4 is a top view of allocating a condenser 10 around a spiral probe 2, FIG. 5 is B—B cross sectional view thereof. In FIG. 4, four holes are installed around a particular spiral probe 2 to bury a condenser 10.

In FIG. 5, a condenser 10 is not required for every spiral probe 2 but sufficient for allocating into a couple of areas to display effect.

Besides, a condenser 10 is functioned by not only installing a commercial goods but also using a condenser attached with an electrode in both side after filling a dielectric material into an insulating substrate.

Figure 6:
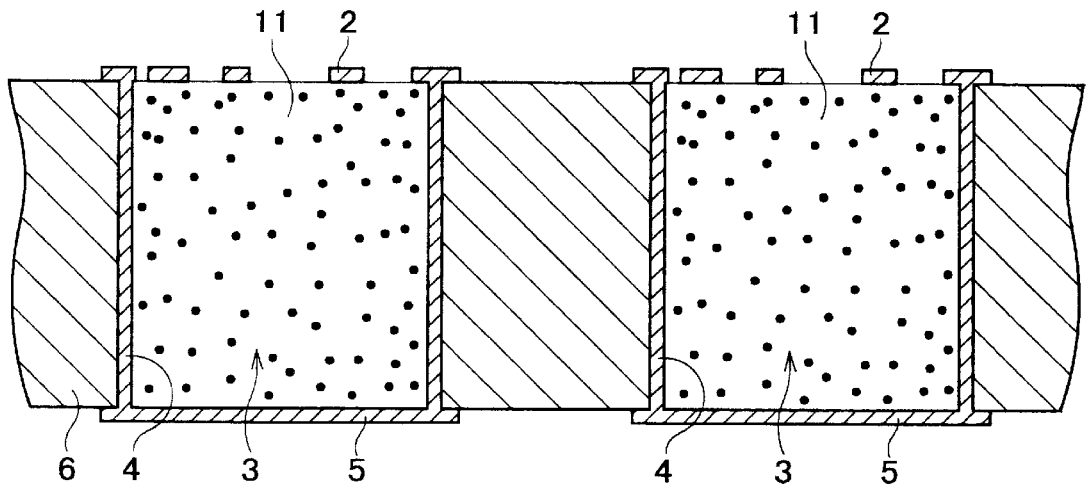
FIG. 6 illustrates a cross sectional view of a spiral contactor regarding to the 5th embodiment of the present invention.
Figure 7:
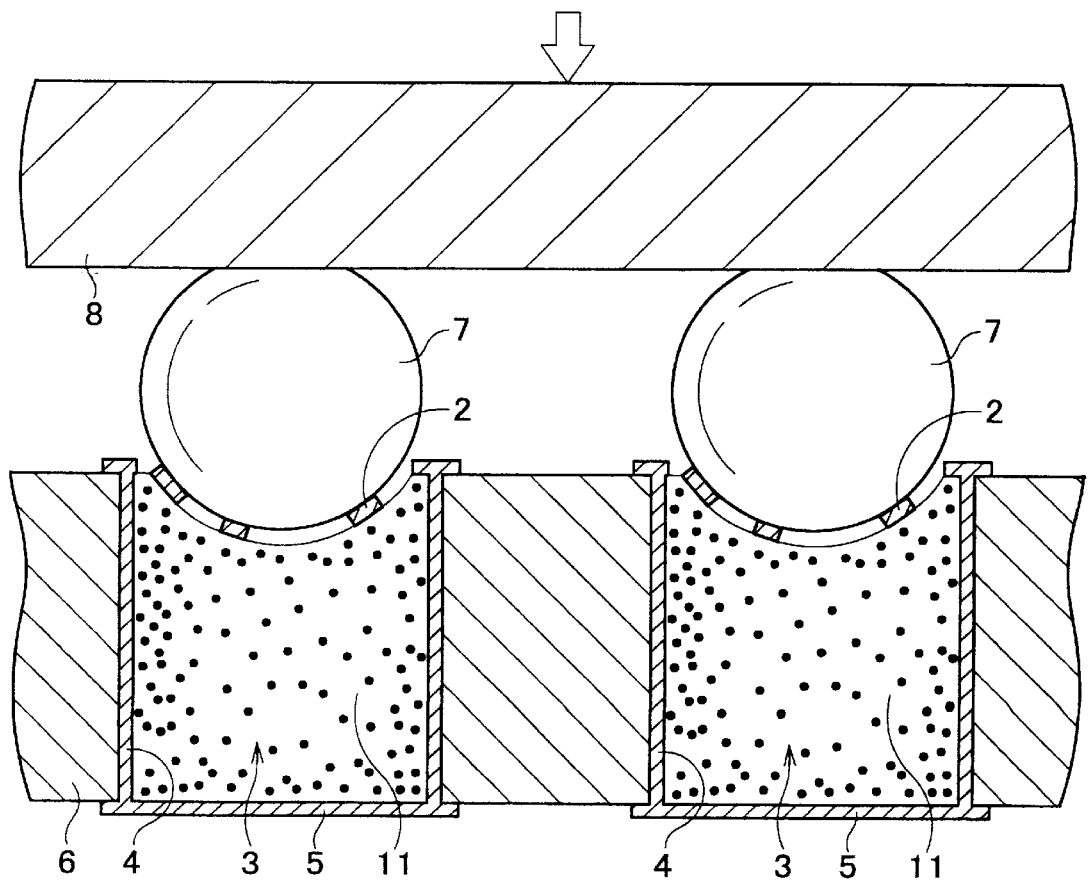
FIG. 7 illustrates a cross sectional view to indicate the situation of contacting with a semiconductor device in the same to the 5th embodiment of the present invention.
Figure 14:
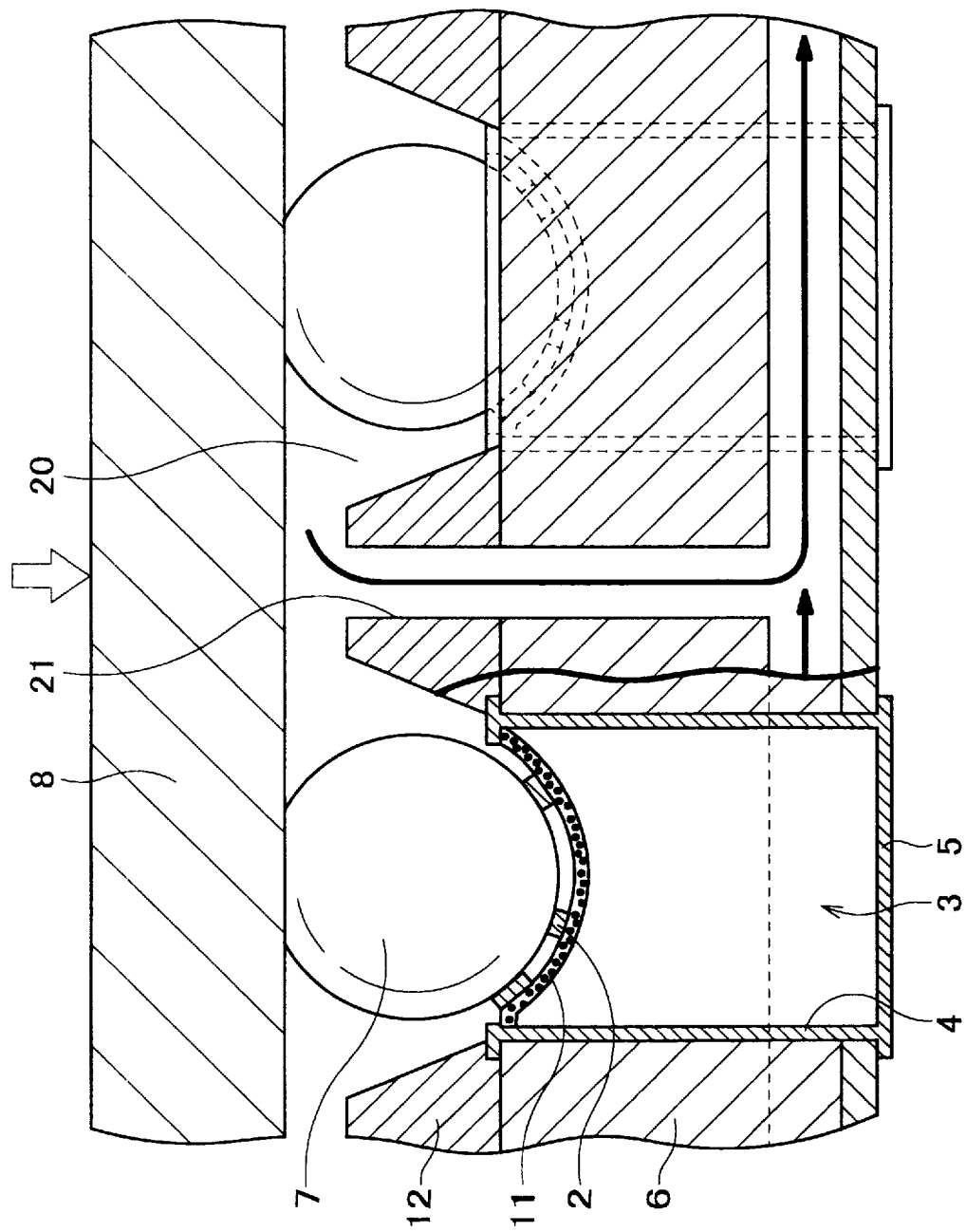
FIG. 14 illustrates an enlarged cross sectional view of a semiconductor inspection device having a spiral contactor regarding to the 10th embodiment of the present invention.

FIGS. 6, 7 and 14 are cross sectional views of a spiral contactor 1 respectively to explain the 5th embodiment of the present invention.

FIG. 6 is a drawing of dispensing a copper plating 4 into an inner hole 3 and stuffing a hole 3 of both top and bottom with a spiral probe 2 and a connecting portion 5 after filling elastic bodies 11 into a hole. This elastic body is a silicon system elastic body (elastmer), however, a polyamide system resin, epoxy system resin or others are also available.

FIG. 7 is a cross sectional view to indicate the situation that a solder ball 7 of semiconductor device 8 is contacted with a top of a spiral probe 2. FIG. 14 is a cross sectional view to indicate a method of treating an elastic membrane 11 as elastic body.

Figure 8:
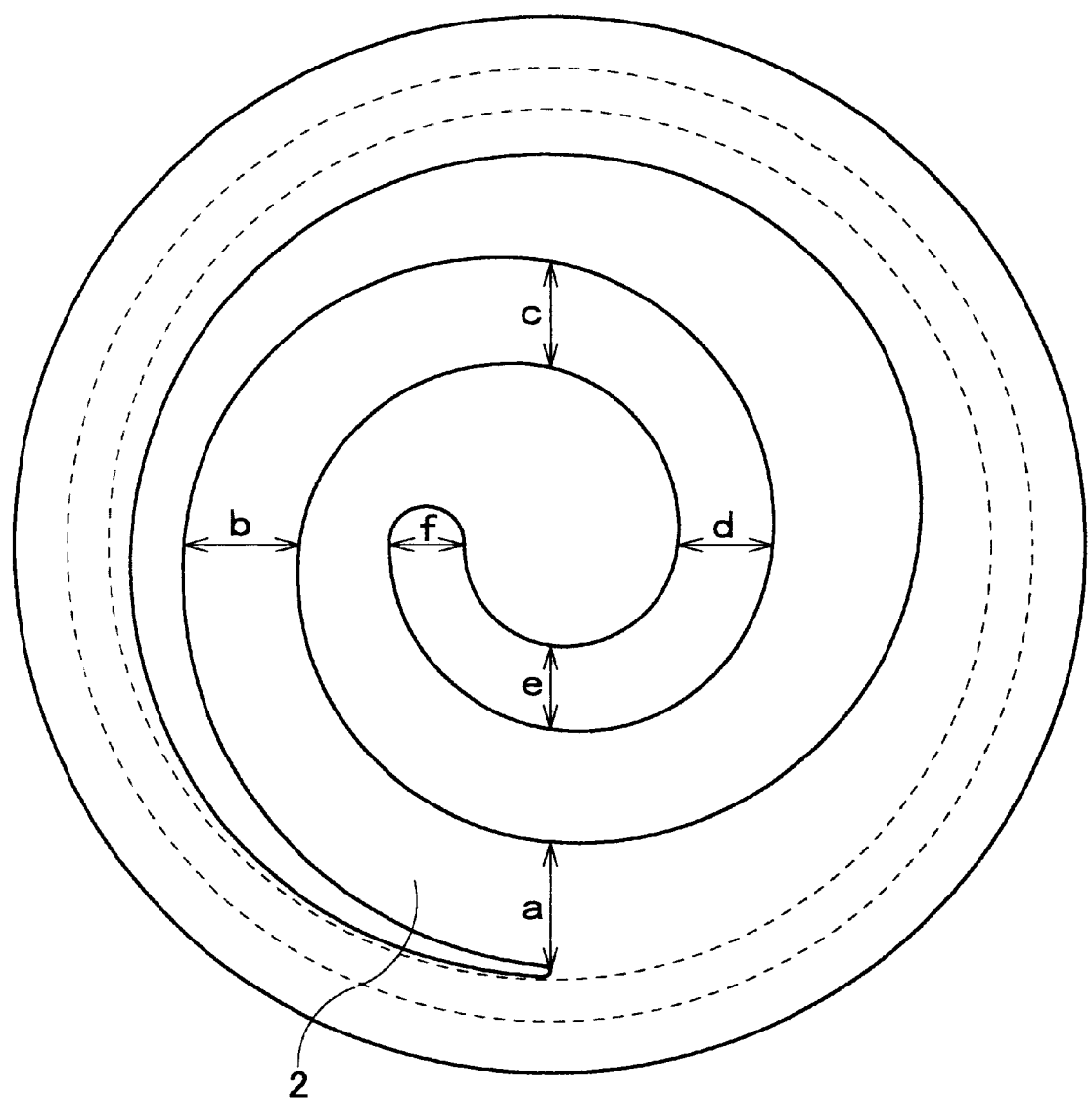
FIG. 8 illustrates an enlarged top view of a spiral probe regarding to the 6th embodiment of the present invention.

FIG. 8 is a drawing to explain the 6th embodiment of the present invention.

FIG. 8 is an enlarged top view of a spiral probe 2, according to the 6th embodiment of invention, each width of a~f is the shape to be formed as relation of a >b>c>d>e>f, the more approaching top, the more narrow wide is.

Figure 9:
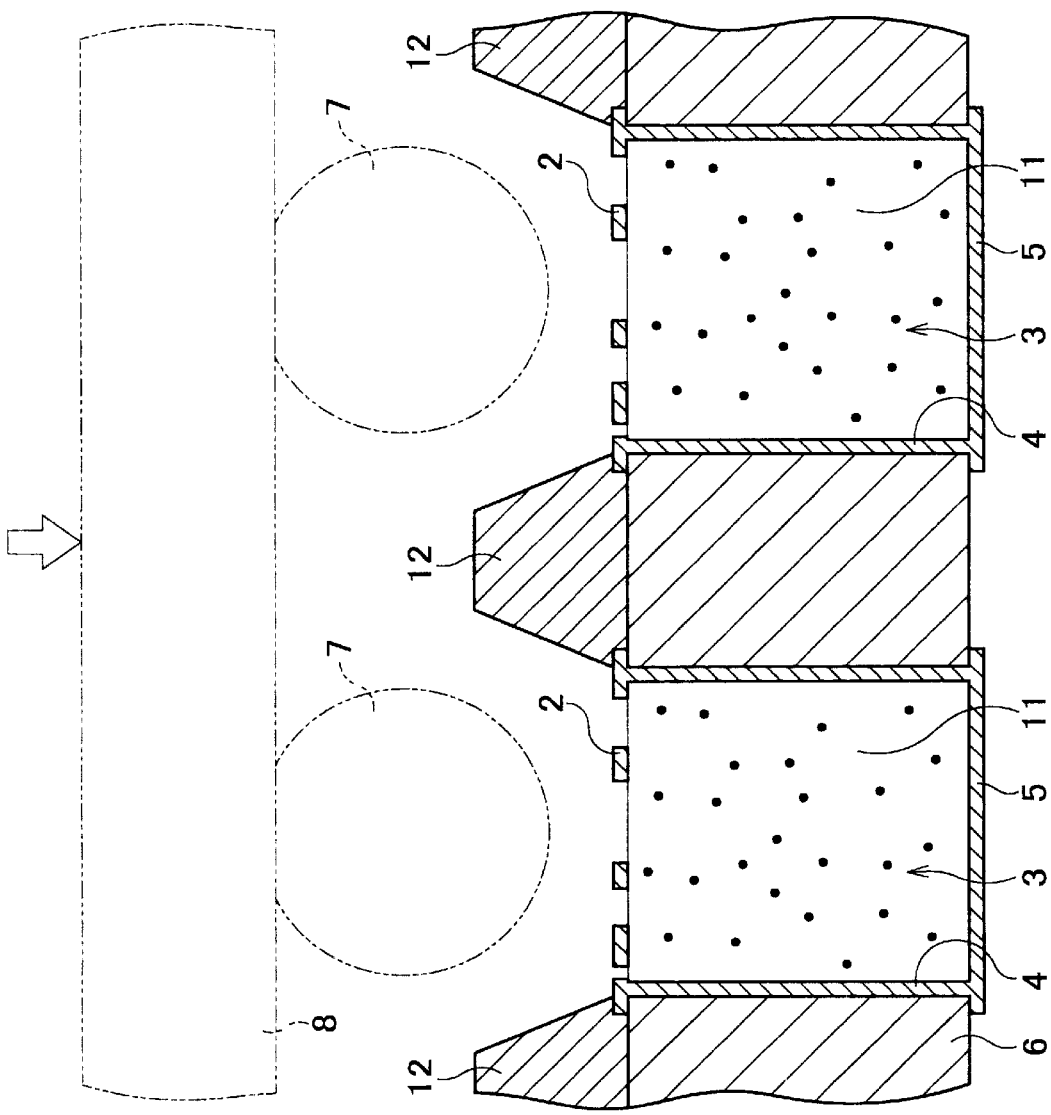
FIG. 9 illustrates a cross sectional view of a spiral contactor regarding to the 7th embodiment of the present invention.
Figure 10:
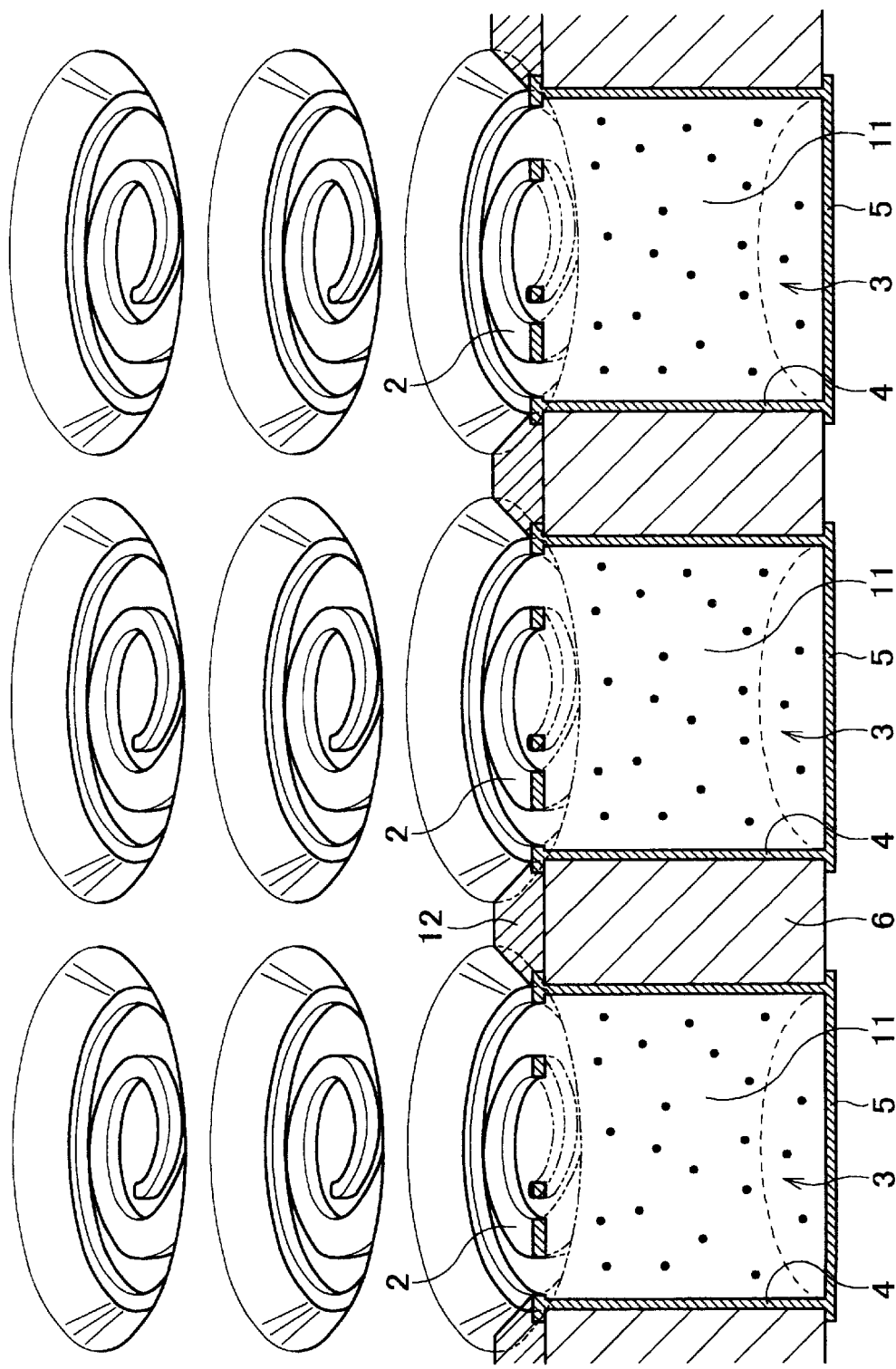
FIG. 10 illustrates a perspective view of a spiral contactor regarding to the same to the 7th embodiment of the example.

FIGS. 9, 10 is a drawing to explain the 7th embodiment of the present invention.

FIG. 9 is a cross sectional view of a spiral probe 2, FIG. 10 is a perspective view of a spiral contactor 1.

In FIG. 9, a height of a guide frame 12 is 40~180 μm with a tilt in an aperture, which causes a solder ball 7 to easily sink and being supported. Otherwise a guide frame 12 plays the role of a stopper to restrict an indention of each solder probe 7.

In FIG. 10, a guide frame 12 having a taper shaped aperture is allocating to each spiral probe 2. A guide frame 12 is a guide to make an easy adjustment of positioning a solder ball 7 of a semiconductor device or a package with a spiral probe 2, and is allocated on an insulating substrate.

Figure 11:
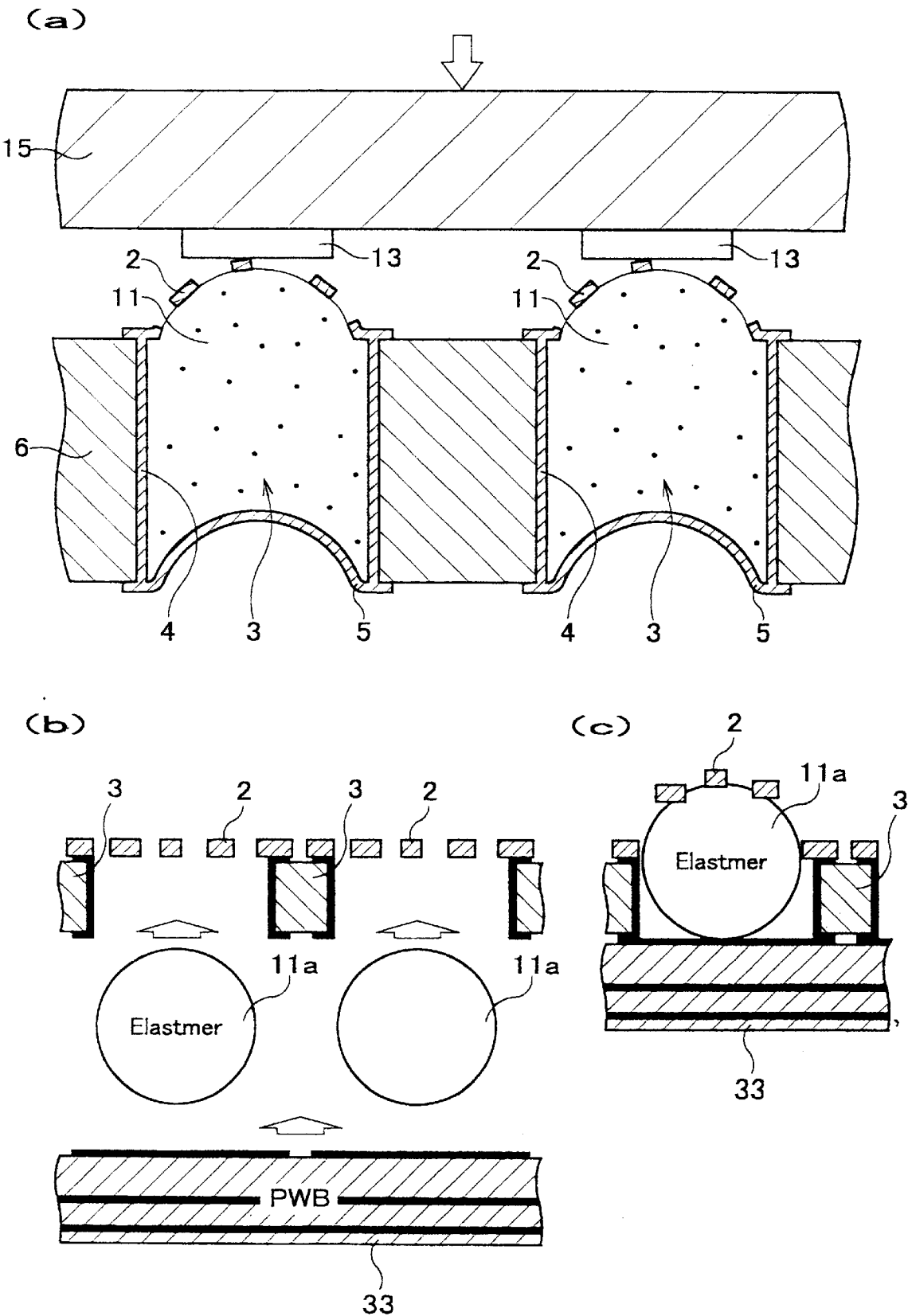
FIG. 11(a) illustrates a cross sectional view of a spiral contactor regarding to the 8th embodiment of the present invention.
FIG. 11(b) is an exploded view to explain another method.
FIG. 11(c) is a cross sectional view of after completing.

FIG. 11(a) is a drawing to explain the 8th embodiment of the present invention.

FIG. 11(a) is a cross sectional view to indicate a shape of a spiral Probe 2 as convex style. A convex shaped spiral probe 2 is formed as a center portion of an elastic body 11 is pressed out by imparting a plastic deformation to a copper plate of connecting portion 5 into a convex shape.

This convex shaped spiral probe 2 is optimized for a bonding pad 13 different from a terminal shape with a solder ball 7. Moreover, FIG. 11(b) is an exploded view to explain another method, FIG. 11(c) is a cross sectional view after completion.

In FIG. 11(b), a spiral probe 2 is formed on an insulating substrate having a through hole 3 to insert an elastomer 11a formed as a sphere into this hole and then block by a print wiring board 33.

Consequently, as indicating in FIG. 11(a), a spiral probe 2 is pressed by a spherical elastomer 11a and a convex shaped spiral probe 2 can be obtained.

Besides, a convex shaped spiral probe 2 is not restricted to the method indicating in FIG. 11(a)~(c), forming into convex shape by using a coil spring is also available.

Figure 12:
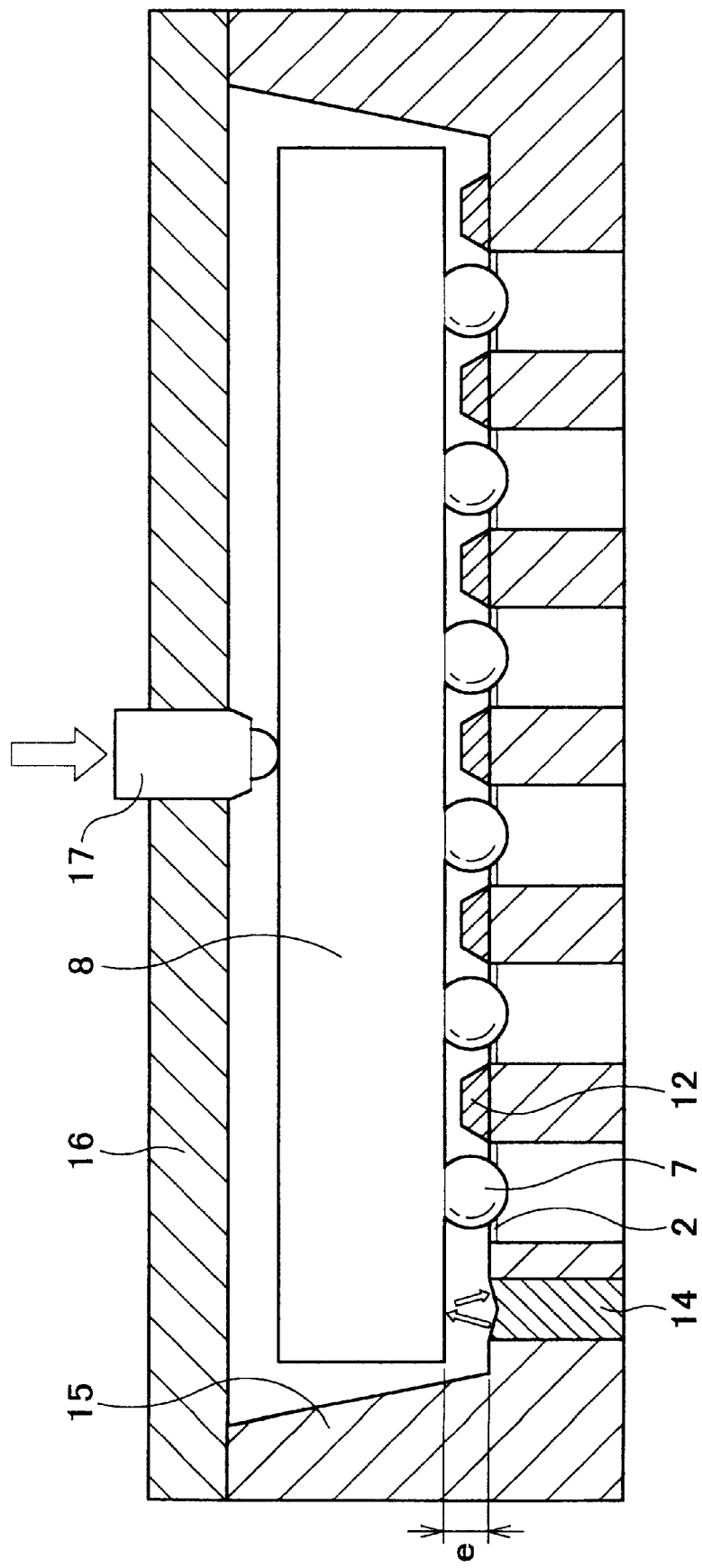
FIG. 12 illustrates a cross sectional view of a semiconductor inspection device having a spiral contactor regarding to the 9th embodiment of the present invention.

FIG. 12 is a drawing to explain the 9th embodiment of the present invention.

FIG. 12 is a cross sectional view to indicate the situation that a semiconductor device 8 or a package of BGA, CSP is loaded into a socket 15 of a semiconductor inspecting device.

An aperture of a socket 15 has a guide portion with a slope as rough guide, and has a device to easily load a semiconductor device 8 or a package. And a solder ball 7 under inspection is held by a guide frame 12, and is rescinded into a spiral probe 2. Secondarily, setting a cover 16 allows a plunger 17 to press a center portion of an object for completing a setting.

A sensor 14 of the present invention is buried in a socket 15 to detect an indentation of an object.

In other words, In case of loading a semiconductor device 8 in socket 15 and setting cover 16, a function of a sensor 14 is to detect a gap e thereof to confirm in advance that a setting is in a proper position. Besides, this sensor 14 is, for example, an electrical proximity switch, however, is not restricted to this.

Figure 13:
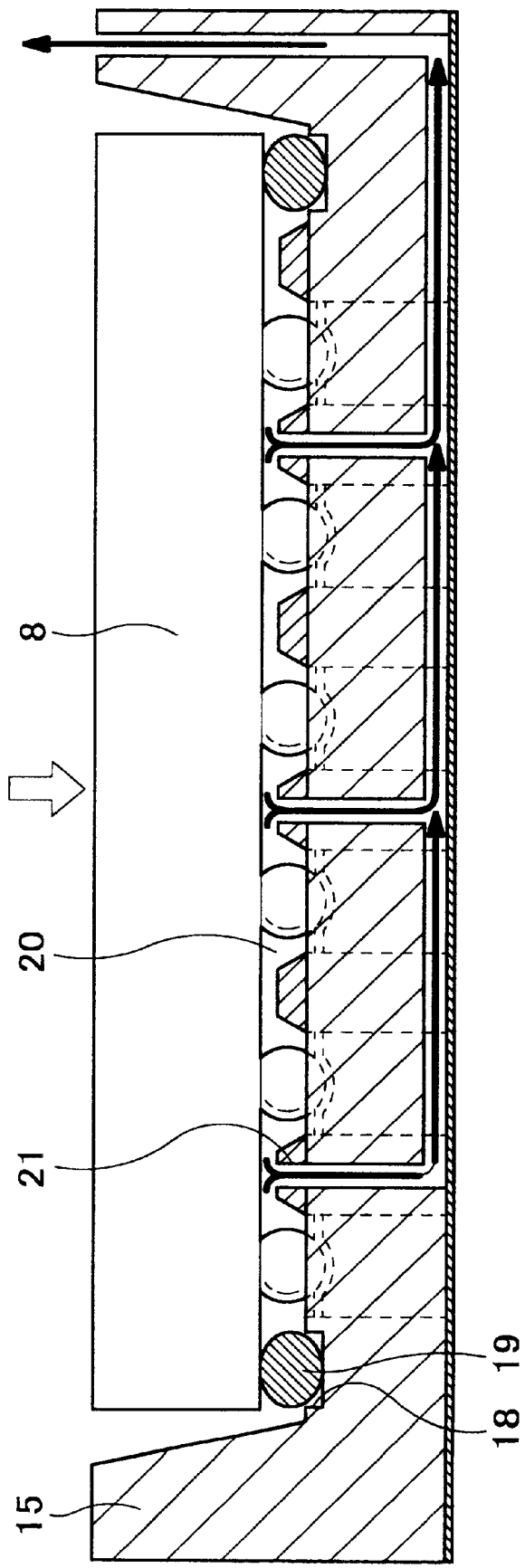
FIG. 13 illustrates a cross sectional view of a semiconductor inspection device having a spiral contactor regarding to the 10th embodiment of the present invention.
Figure 15:
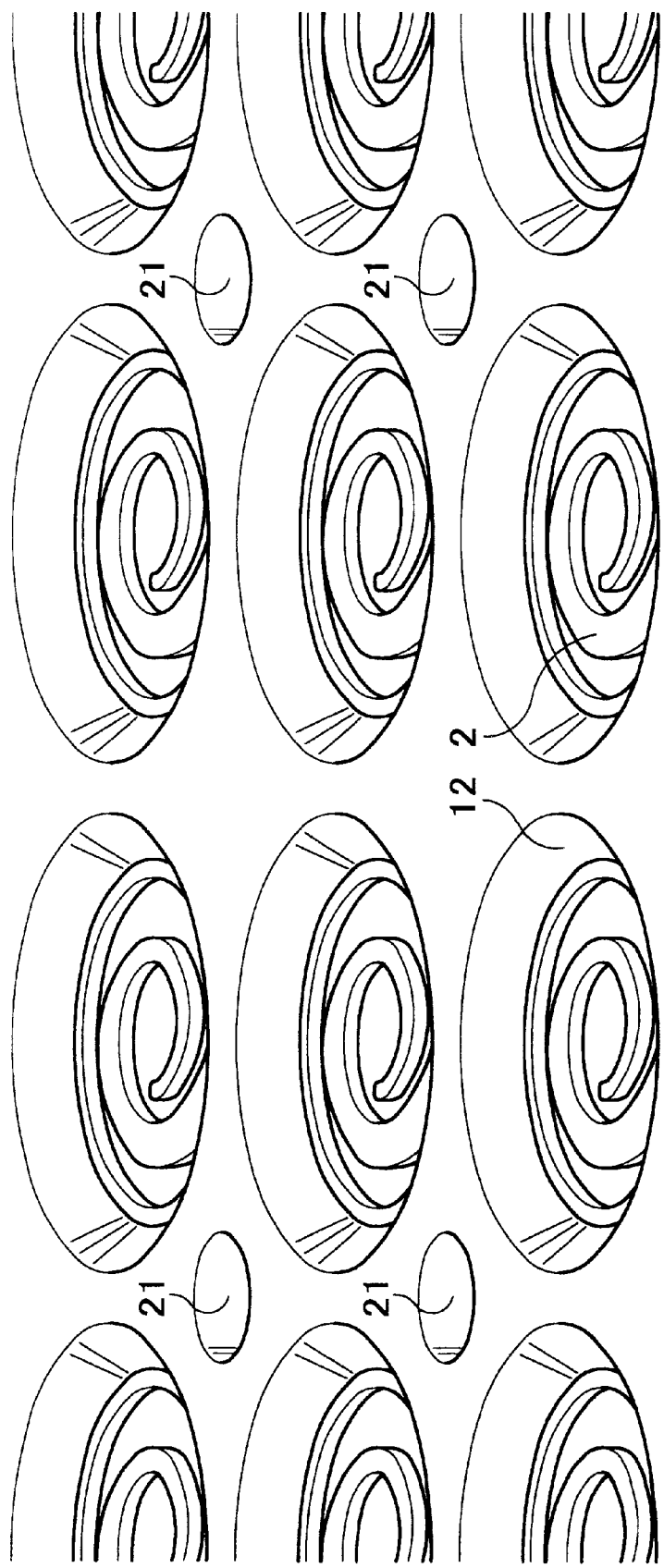
FIG. 15 illustrates a perspective view of a semiconductor inspection device having a spiral contactor regarding to the 10th embodiment of the present invention.

FIGS. 13, 14, 15 is a drawing to explain the 10th embodiment of the present invention, which is a cross sectional view to indicate the situation of loaded into a socket, one part of enlarged view of that cross sectional view, and a perspective view. In FIG. 13, the present invention is characterized as having a sealant 19. A sealant 19 is an annular shape inserted into an annular groove 18. Though a sealant 19 in FIG. 13 is subject to O ring as example, this is not restricted to O ring, other objects and method is acceptable as long as air tight can be secured by such as sealant like a gasket or gel.

A socket 15 and a semiconductor device 8 can secure air tight due to sealant 19 around them, which cause a sealed cabin 20 to be formed.

FIG. 14 is an enlarged cross sectional view of the area including air outlet 21 of FIG. 13. An elastic body 11 is an elastic membrane, air tight is secured. A plurality of air outlet 21 is allocated to around a spiral probe 2, the pressure between a socket 15 and a semiconductor device 8 under inspection turns into an equivalent adsorbent force for both one to contact each other by evacuating air of sealed cabin 20 from an air outlet 21. In other wards, it is a vacuum adsorbing method substitute to a conventional mechanical pressing method. Accordingly, a cover 16 indicating in said FIG. 12 and pressing parts corresponding plunger 17 is unnecessary. Besides, said air outlet 21 turns into air supply port to supply air in opposite case when releasing adhesion for both one.

FIG. 15 is a perspective view to indicate the allocation of air outlet 21 installing in a guide frame 12. A plurality of air outlet 21 is installed in a guide frame 12.

Figure 16:
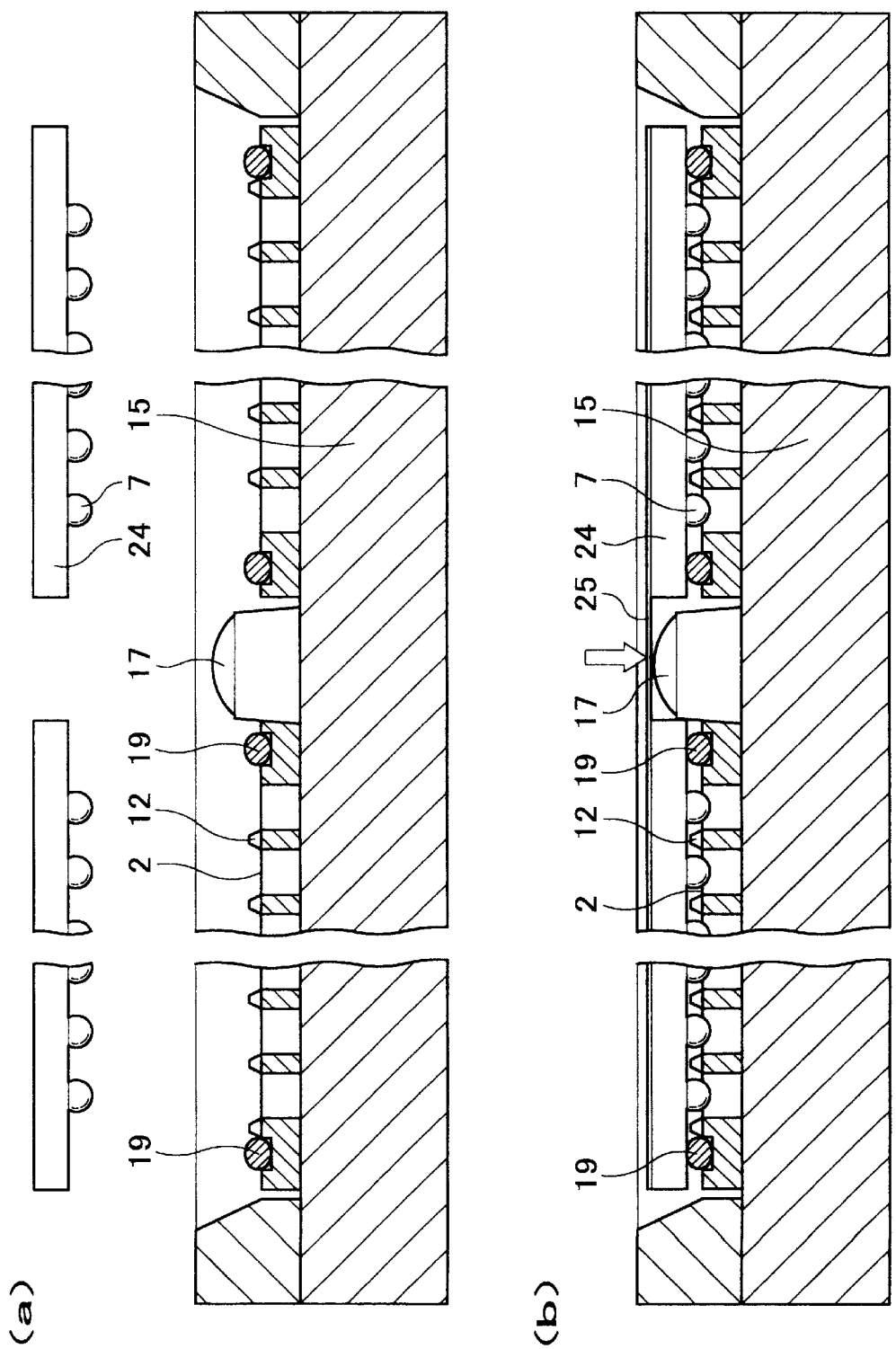
FIG. 16 illustrates a cross sectional view of semiconductor inspection device having a spiral contactor regarding to the 10th embodiment of the present invention.
Figure 17:
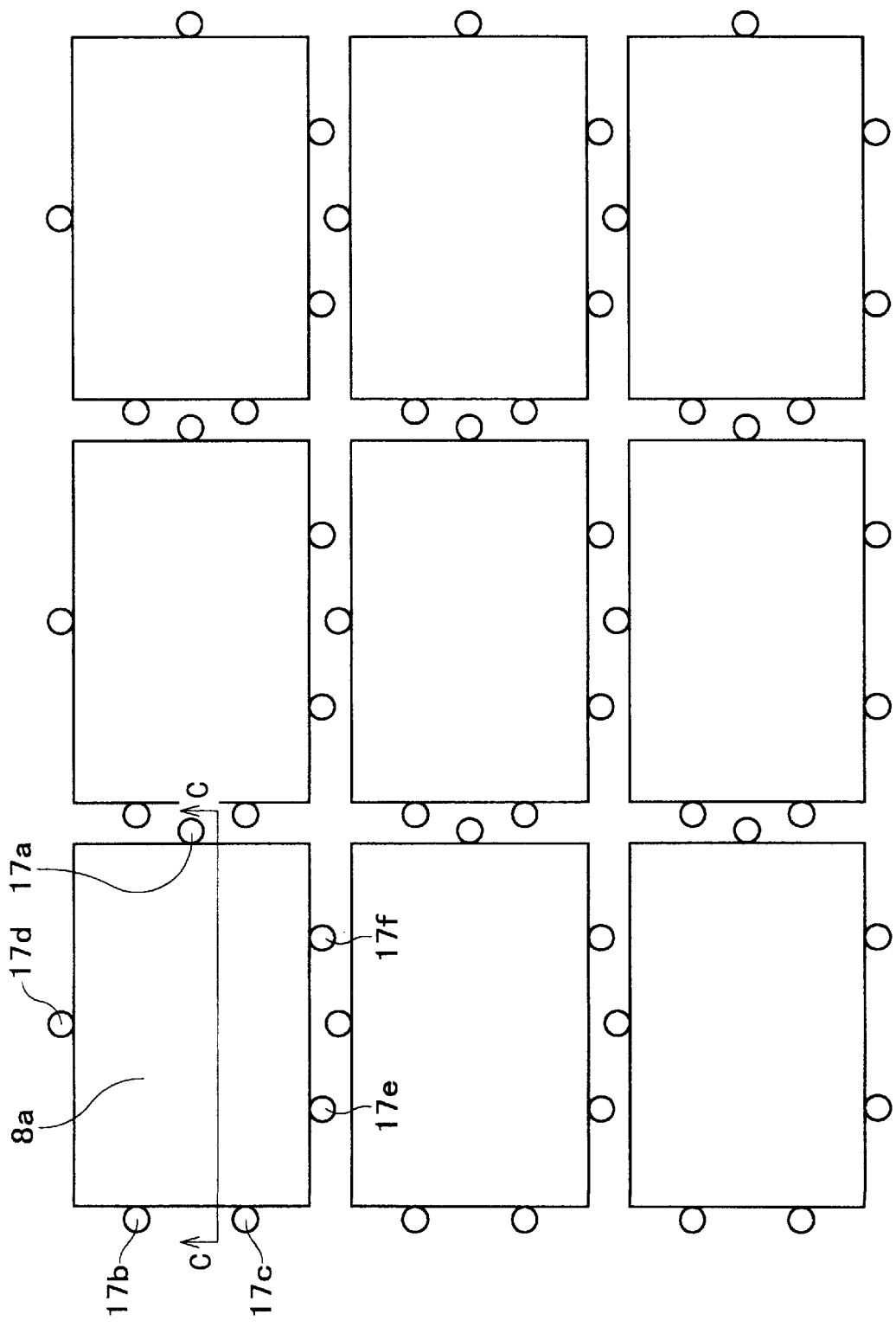
FIG. 17 illustrates a top view to indicate the position of plunger of a semiconductor inspection device regarding to the 10th embodiment of the present invention.

FIGS. 16, 17 is also a drawing to explain the 10th embodiment of the present invention. FIG. 16(a) is a cross sectional view of a socket 15 to load a plurality of semiconductor device 8 or a tip 24 of wafer level, and FIG. 16(b) is a cross sectional view of a socket 15 after loading. A pressing method for both one is a vacuum typed adsorption. FIG. 17 is a top view thereof to indicate an allocation of a plunger 17. In FIG. 17,for example, in case of a semiconductor device 8a, plunger 17a, 17b and 17c are in a set of 3 for positioning horizontal direction, and plunger 17d, 17e and 17f are in a set of 3 for positioning vertical direction.

FIG. 18 is a drawing to explain the 11th embodiment of the present invention.

FIG. 18, is a pneumatic circuit diagram of a vacuum adsorption FIG. 18(*a*) is in case of desorption for semiconductor device 8 under inspection, FIG. 18(*b*) is in case of adsorption for semiconductor device 8 under inspection.

In FIG. 18(*b*), in case an object is loaded, when turning on a solenoid valve, a port is switched to connect [P] with [A] since a solenoid valve is excited, the air in the sealed cabin formed with inspection body and object is adsorbed by a vacuum pump, an object is adsorbed to turn on pressure sensor.

In FIG. 18(*a*), in case of desorbing an object, turning off a solenoid valve cause a port to be initial position by spring force, adsorption is releases by absorbing air into vacuum area. Besides, though this pressure sensor is an electric pressure sensor, other sensor is also acceptable.

Figure 19:
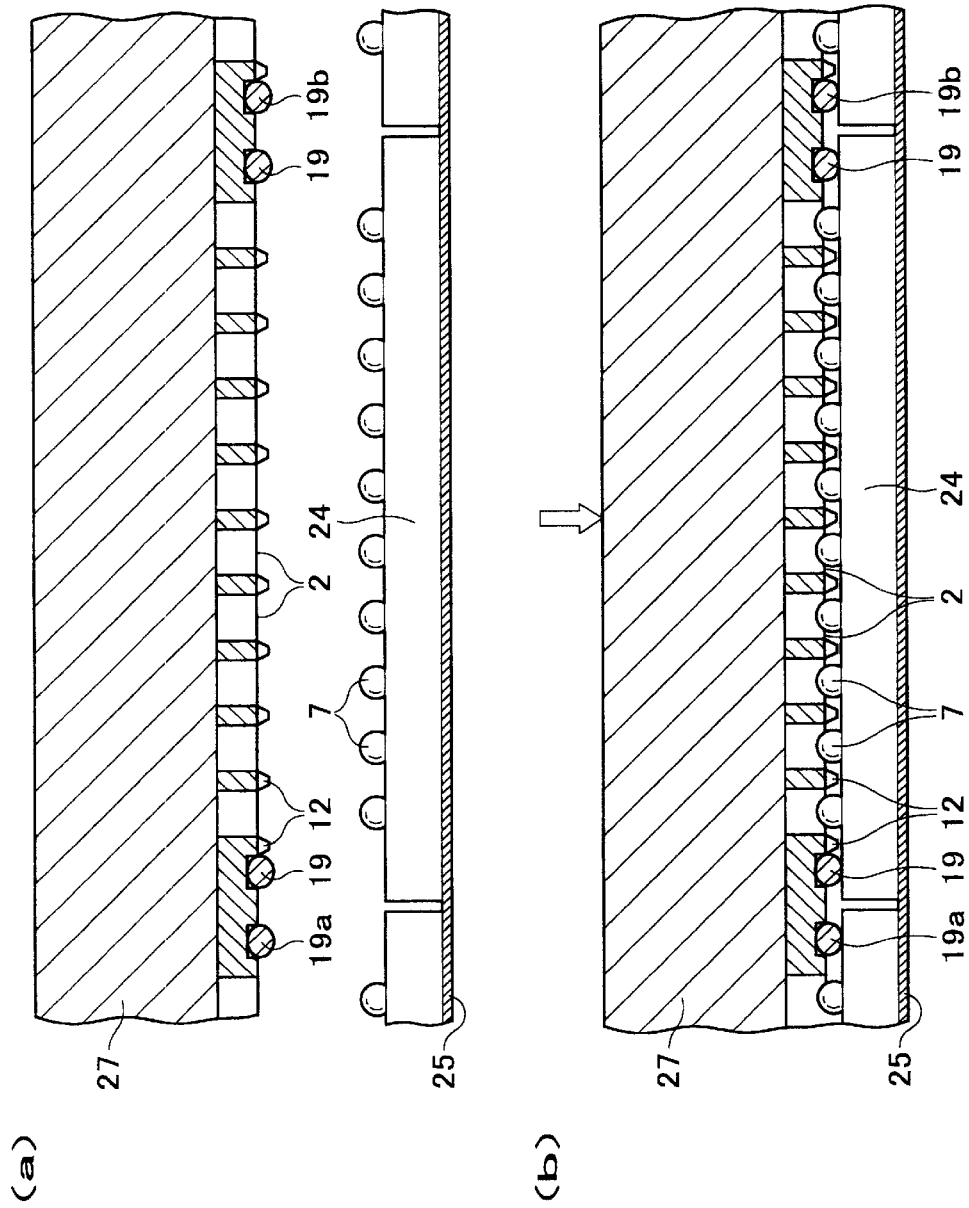
FIG. 19 illustrates a cross sectional view to indicate a semiconductor inspection device regarding to the 12th embodiment of the present invention.

FIG. 19 is a drawing to explain the 12th embodiment of the present invention.

Figure 21:
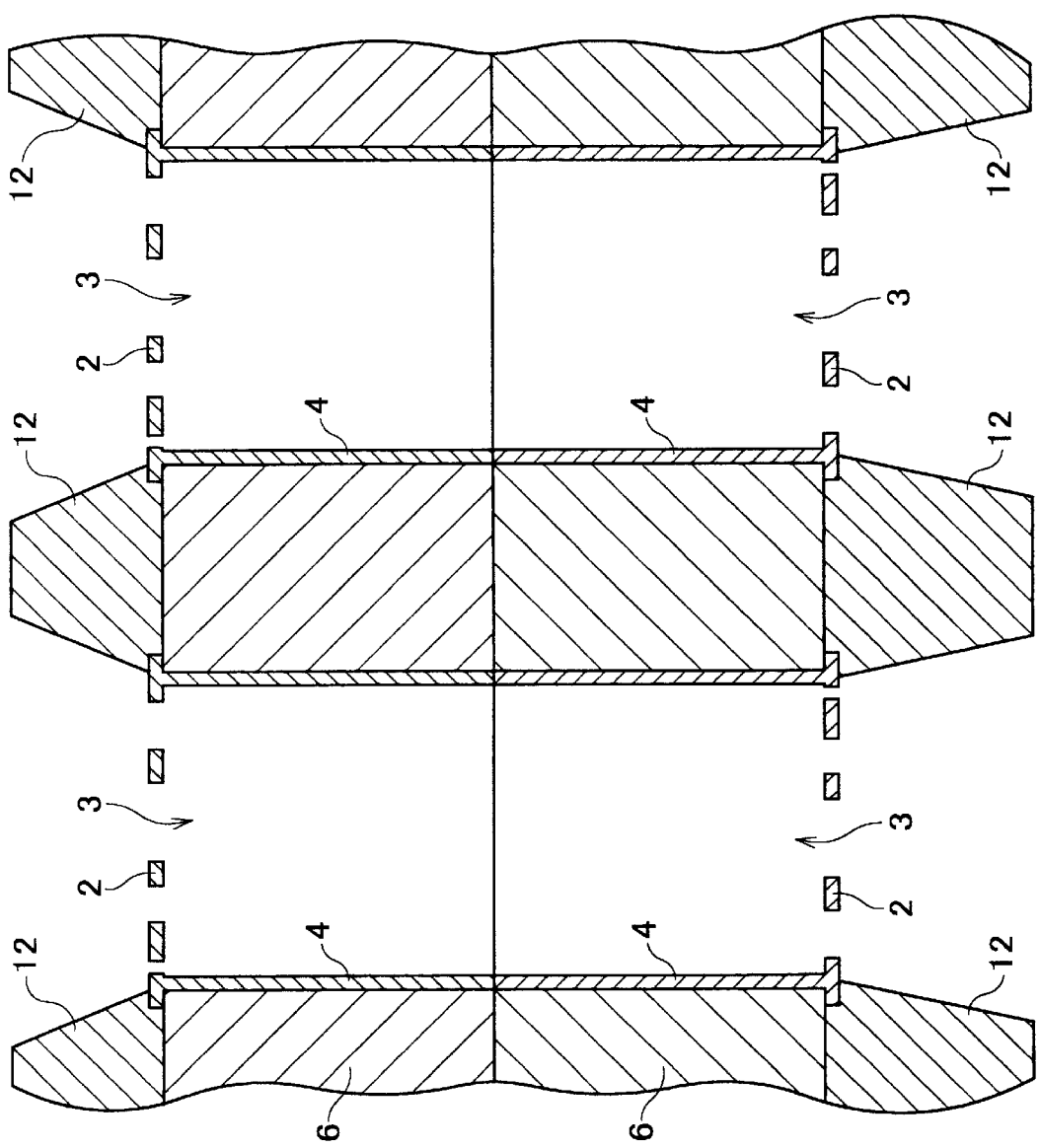
FIG. 21 illustrates a cross sectional view of a semiconductor inspection device having a spiral contactor in both side regarding to the 13th embodiment of the present invention.

FIG. 19(*a*) is a cross sectional view to indicate the situation before loading probe card 27 of a semiconductor device under the condition light after sticking wafer to UV tape 25 for warfare mounting and dicing, FIG. 21(*b*) is a cross sectional view to indicate the situation after loading. The pressing method for both one is a vacuum adsorption. The conventional inspection by a probe card is restricted to wafer before dicing, however, the probe card 27 of the present invention is able to compatible with one after dicing. This reason can be attributed to an addition of a function for positioning to hold solder balls by guide frame 12 even though infinitesimal incoherence is yield by dicing.

Figure 20:
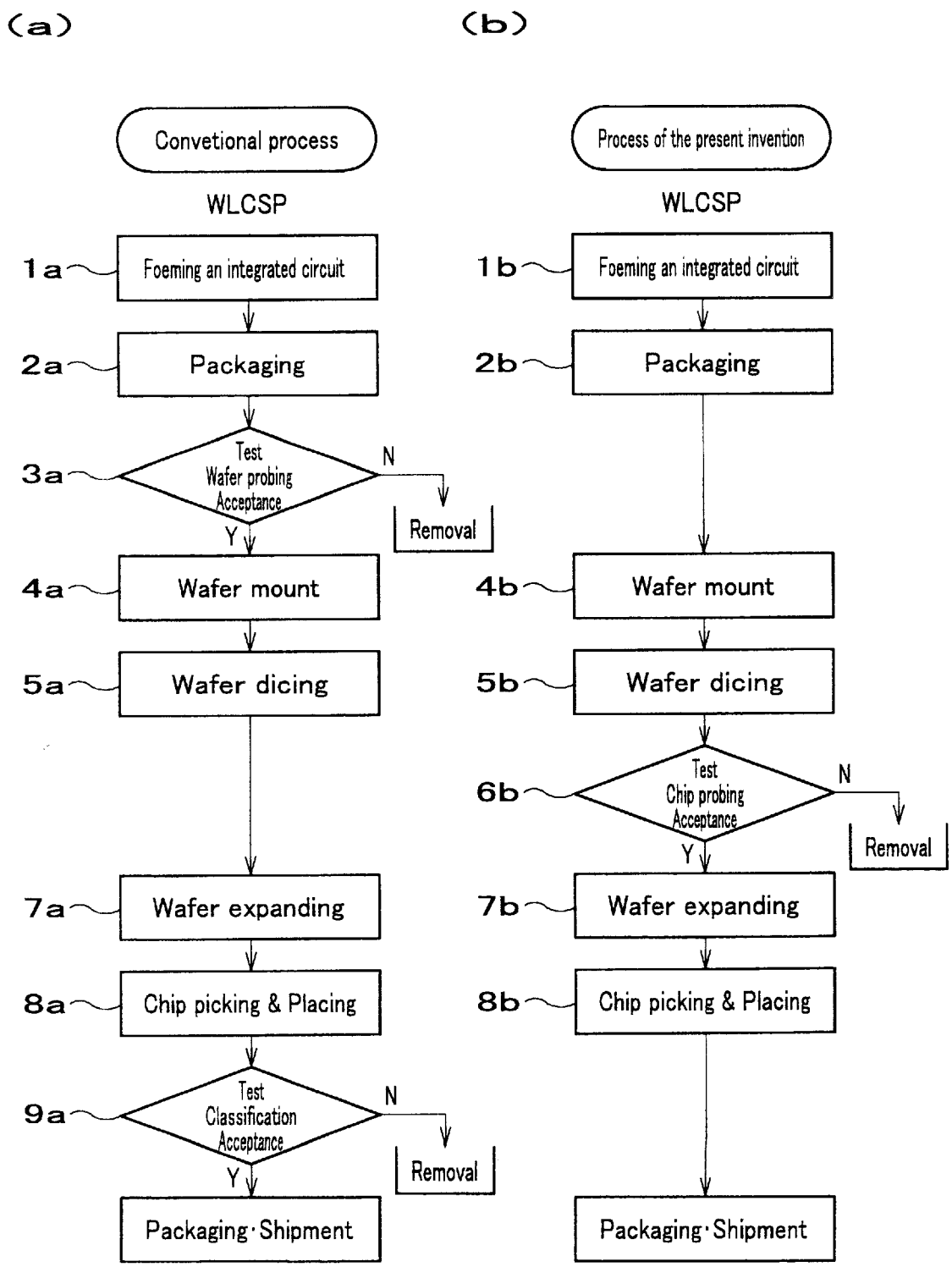
FIG. 20 is a flow chart compared the present processing diagram (a) with the processing diagram of the present invention (b) for explanation of the 12th embodiment of the present invention.

FIG. 20 is a flow chart to compare a conventional process (a) in wafer level with a process (b) of the present invention. In FIG. 20(*a*), the inspection process of using a probe card requires twice, One is the inspection process called as wafer probing 3*a* which is inspection before dicing, and the other one is the inspection by a handler 9*a* before packaging and delivery. This reason is that there is possibility to produce a defective product by the process of wafer dicing 5*a*. On the other hand, a process of the present invention(b) requires only one inspection by the inspection process called as a chip probe 6*b* after wafer dicing 5*a*.

Figure 22:
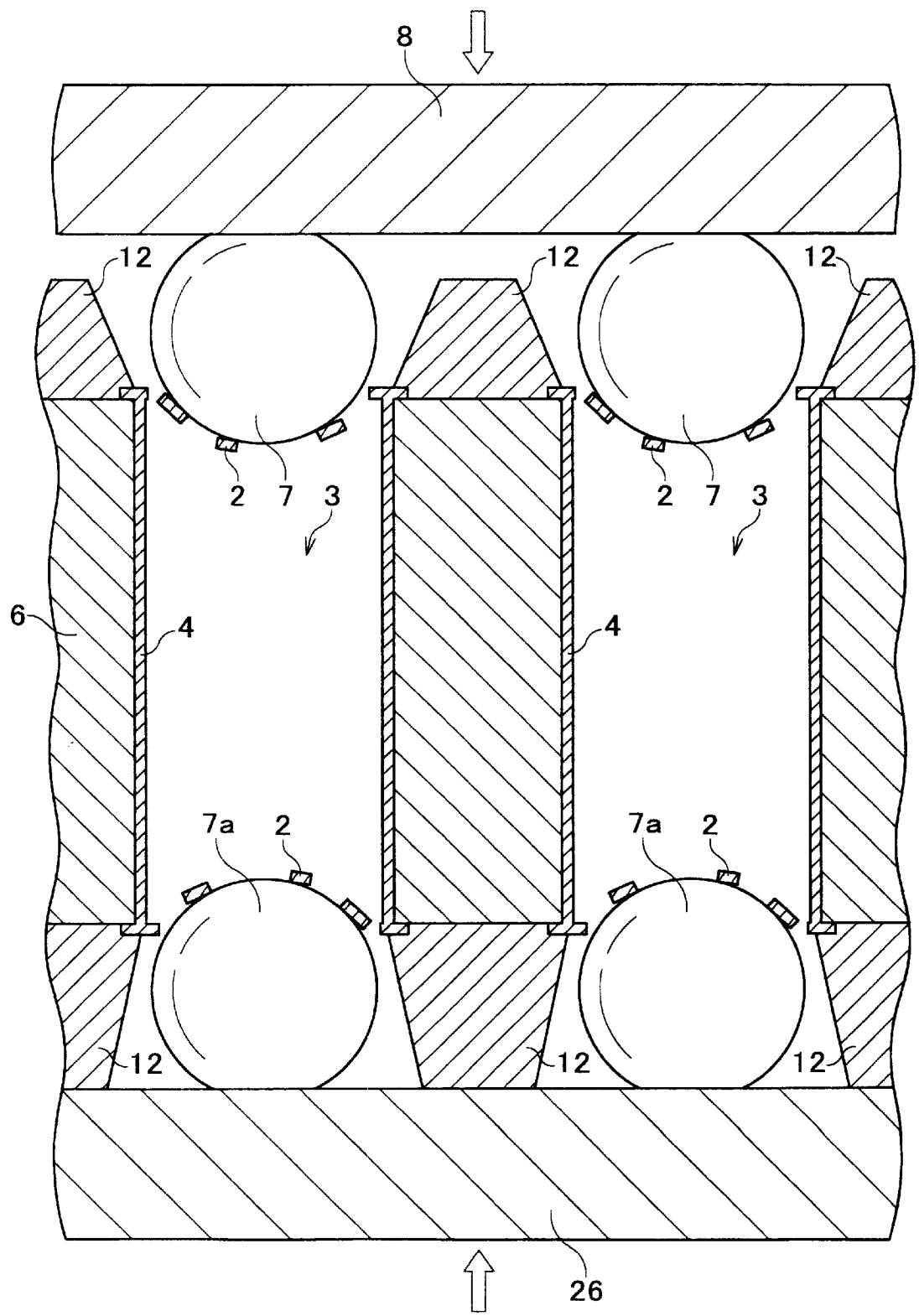
FIG. 22 illustrates a cross sectional view of a semiconductor inspection device of contacting a semiconductor device and a connector with both side of a spiral contactor regarding to the 13th embodiment of the present invention.

FIGS. 21, 22 is a cross sectional view to explain the 13th embodiment of the present invention.

In FIG. 21, a spiral probe 2 is allocated to both side of an insulating substrate.

In FIG. 22, contacting to upper surface of alternative contacting is semiconductor device 8, and contacting bellow surface is a metal ball 7*a* having function [meal] of connector 26. A connector 26 of bellow surface is fixed to stay for continuation under the set condition, only a semiconductor device 8 of upper surface is replaced.

Besides, the way of allocating spiral probe 2 to both sides is to allocate to one side of insulating substrate 6 as indicating in FIG. 21, or to superpose to adhere them by a conductive adhesive to be both side allocating as indicating in FIG. 22 to be unified type.

Figure 23:
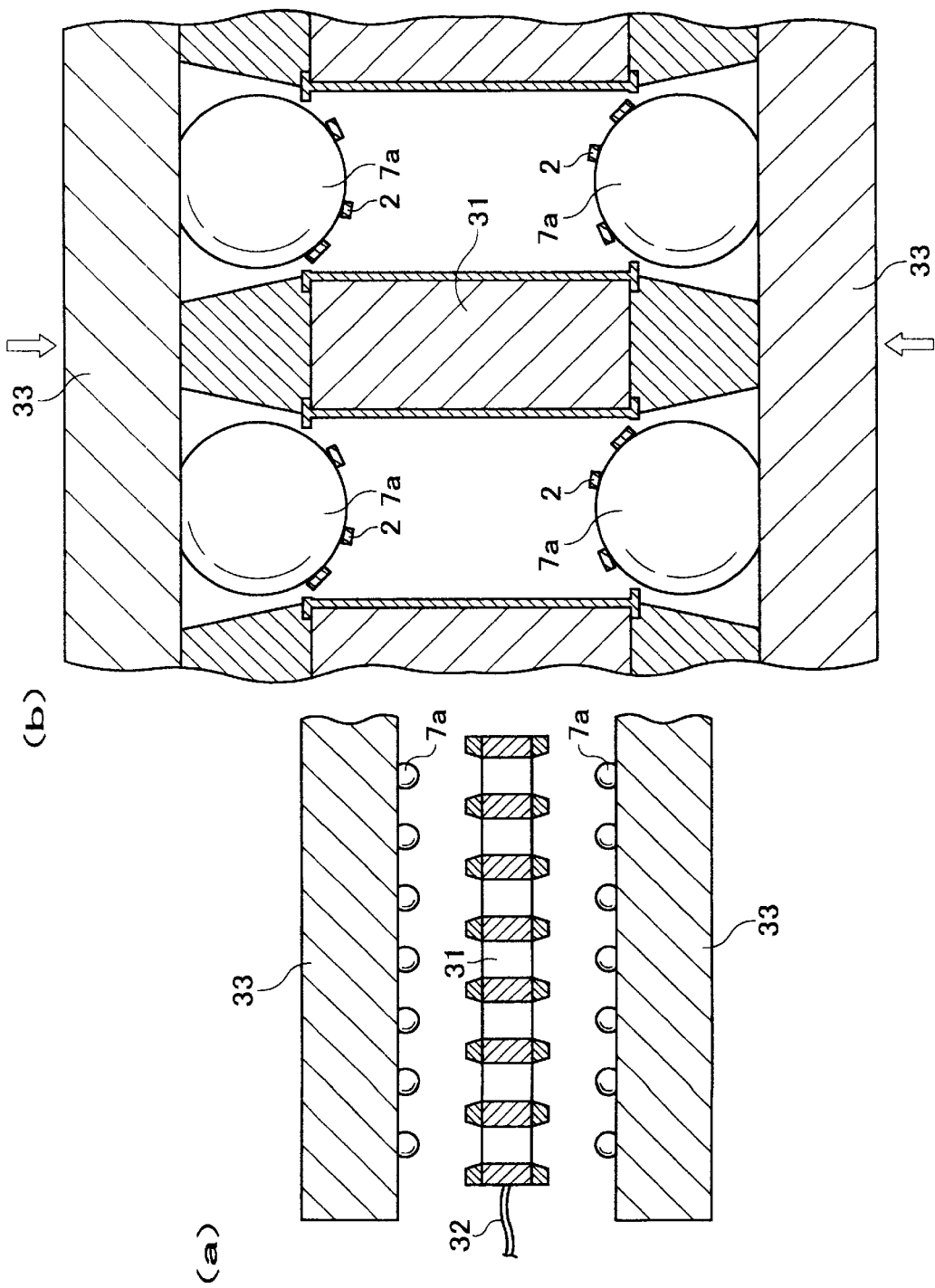
FIG. 23, regarding to the 14th embodiment of the present invention, (a) is a section type of before connecting with both side of a spiral contactor, and (b) is a cross sectional view of electronic parts to indicate a connected situation.

FIG. 23 is a drawing to explain the 14th embodiment of the present invention.

FIG. 23(*a*) is a type section to indicate the situation before connecting with both side of spiral contactor, a partner of ups and downs for connecting is a print wiring board of PWB (Print Wire Board) 33. FIG. 23(*b*) is an enlarged cross sectional view of electric parts 31 (such as connector) to indicate the situation connected with PWB 33. This allows electronic parts to materialize miniaturization, maximum thinning down and lightening, and to capacitate for excellent high frequency electric characteristics and high-density mounting.

A minimum thickness of connector in a conventional pin method is 5 mm, on the other hand, the minimum thickness of connector in a spiral connector of the present invention is 1 mm, consequently, since thinning down into ⅕ is practical, a high frequency electrical characteristics is largely improved, and high density is practical.

Figure 24:
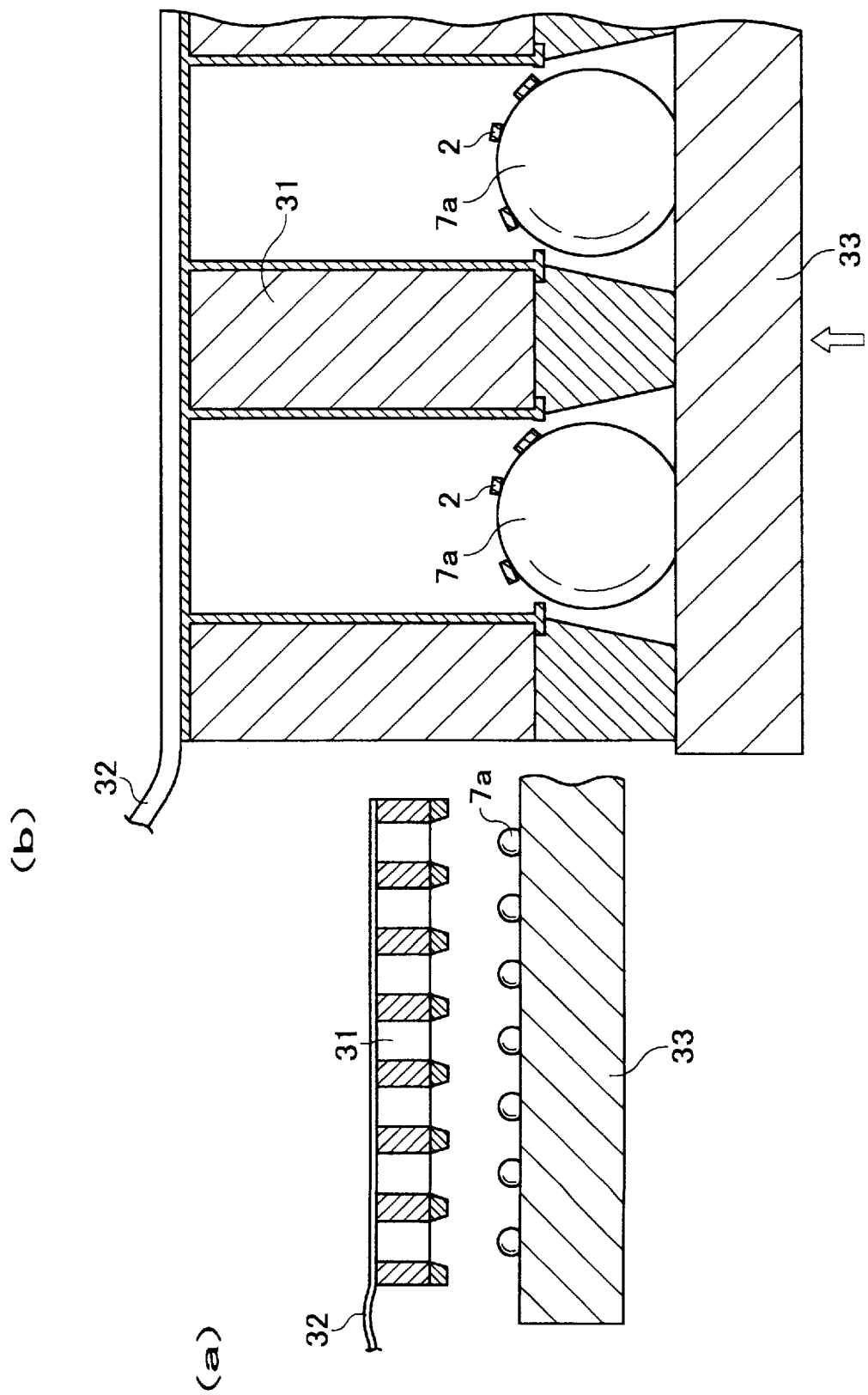
FIG. 24, regarding to the 15th embodiment of the present invention, (a) is a cross sectional view of connected with electronic parts having aligned spiral contactors with one side of connector cable, and (b) is a cross sectional view of before connecting.

FIG. 24 is a drawing to explain the 15th embodiment of the present invention.

FIG. 24(*b*) is an enlarged cross sectional view to indicate the situation that electronic parts 31 (such as connector) having aligned spiral contactors are connected with at least one side edge of connector cable 32, FIG. 24(*a*) is a type section to indicate the situation before connecting. Like aforesaid, electronic parts largely improved high frequency electrical characteristics can be provide by adopting spiral contactors. Beside, an electronic part 31 having aligned spiral contactors can be allocated not only to one side but also to both sides.

EXAMPLES

Following is the explanation about one example of the manufacturing method of a spiral contactor 1.

FIGS. 25~32 is a cross sectional view to explain about the manufacturing process of a spiral contactor 1. However, this is an occasion that elastic bodies 11 are filled into a hole 3 of insulating substrate 6. Following is the explanation in accordance with a process order.

Figure 25:
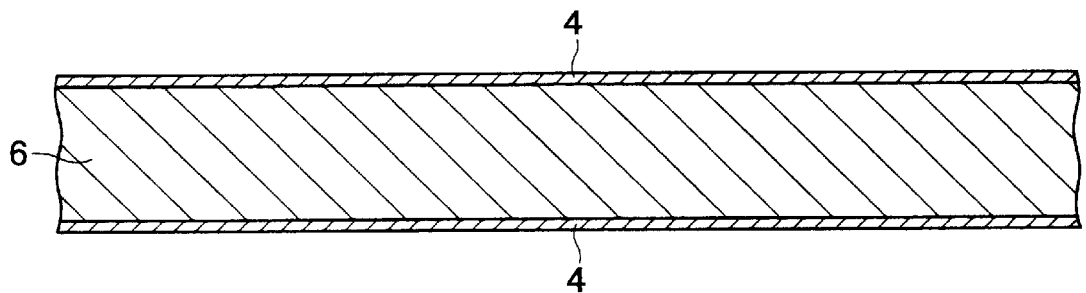
FIG. 25 illustrates a cross sectional view to explain the manufacturing process of a spiral contactor 1, which is a process of a copper plating as the first process thereof.

In FIG. 25, an insulating substrate 6 is a glass epoxy (FR-4) of 0.3 mm in thick, and a copper plating 4 of 5~18 μm in thick is dispensed into both side thereof.

Figure 26:
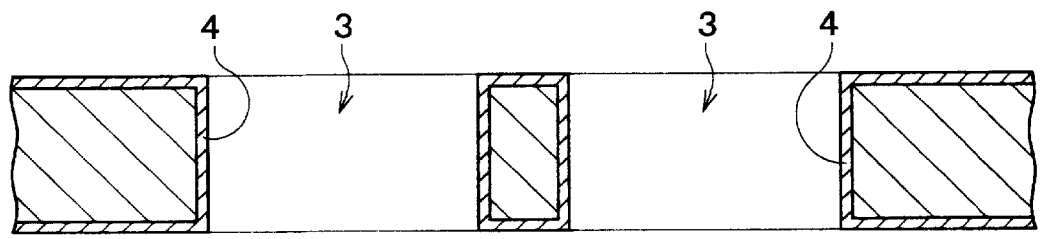
FIG. 26 illustrates a holing process and a copper plating process in the second and the third process.

In FIG. 26, establishing holes (commonly called as through hole) 3 by a drill and dispensing a copper plating 4 on whole surface can provide a carry-current circuit of perpendicular wiring method in inner hole 3.

Figure 27:
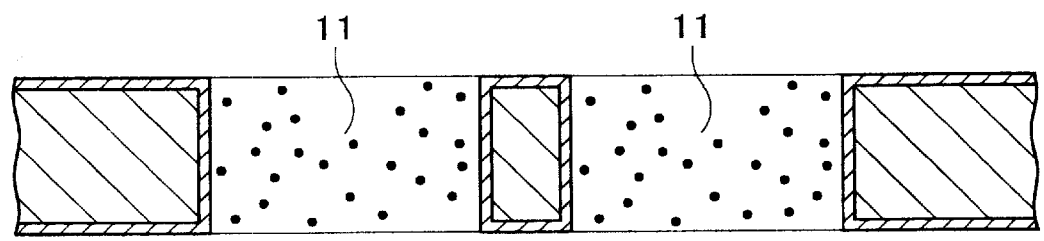
FIG. 27 indicates a process of filling elastic bodies and a process of a surface finish in the 4th and 5th process.

In FIG. 27, filling elastic bodies (silicon system elastomer) 11 in hole 3, and remove convex and concave portion by surface processing.

Figure 28:
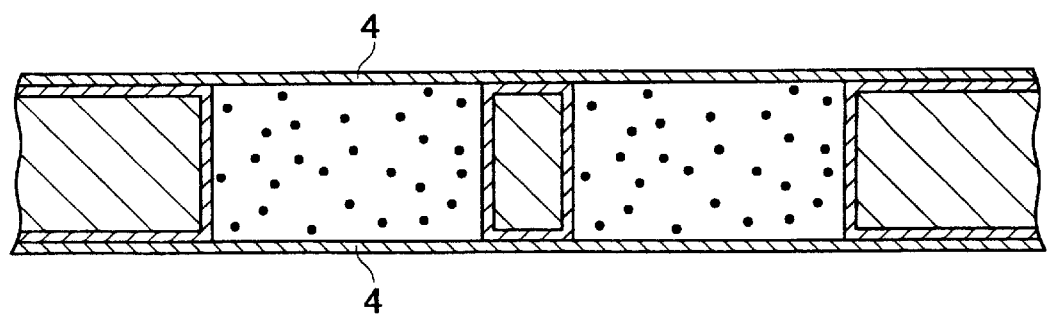
FIG. 28 indicates a copper plating process in the 6th process.

In FIG. 28, dispensing a copper-plating 4 to whole surface.

Figure 29:
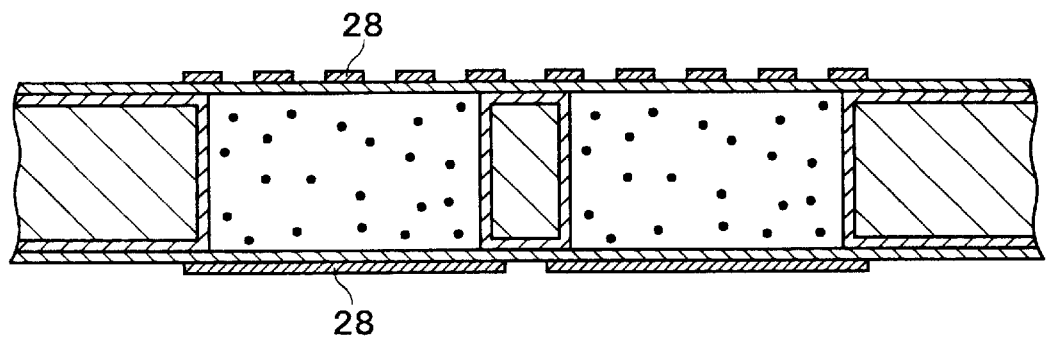
FIG. 29 indicates a masking process for etching in the 7th process.

In FIG. 29, forming a spiral shaped membrane on upper surface and circular shaped membrane on bellow surface by etching.

Figure 30:
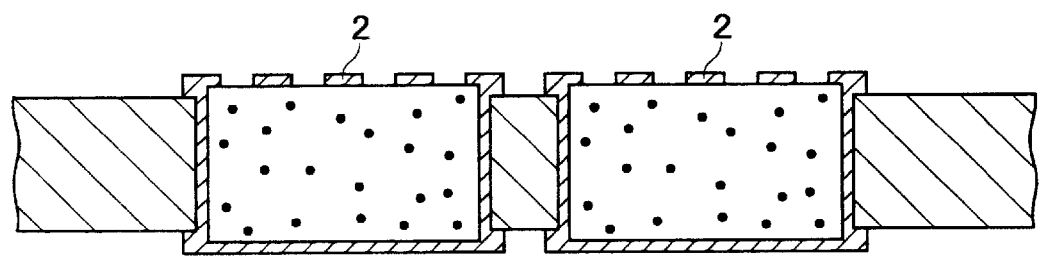
FIG. 30 indicates an etching process in the 8th process.

In FIG. 30, forming a shape of a spiral probe 2 by etching whole surface.

Figure 31:
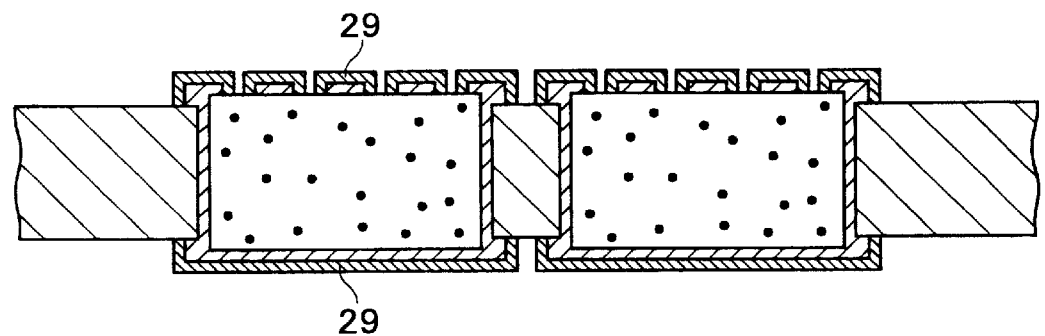
FIG. 31 indicates a plating process in the 9th process.

In FIG. 31, dispensing a nickel-plating 29 on both upper and bellow surface.

Figure 32:
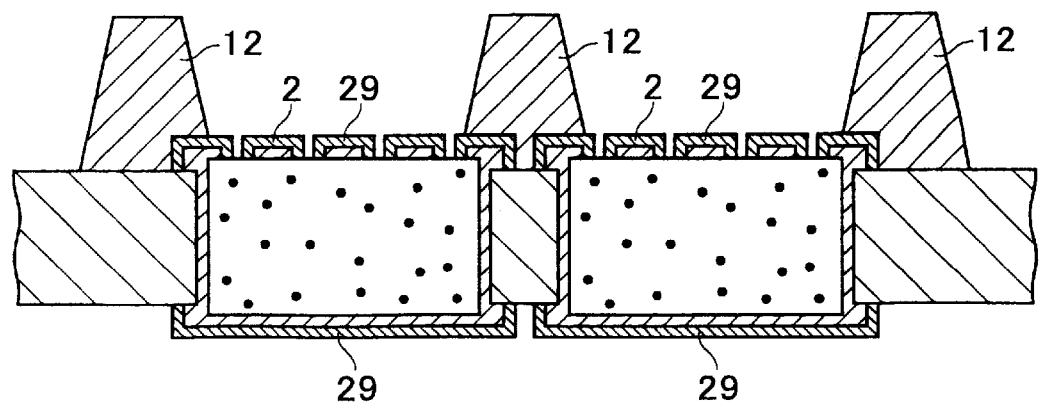
FIG. 32 indicates a cover-lay treatment process in the 10th process.

In FIG. 32, forming a guide frame 12 by a cover-lay treatment. Producing spiral contactor is practical by obeying an aforementioned processing order.

FIG. 33 indicates an example of embodiment adopting a socket 40 in a spiral probe 2. FIG. 33(*a*) is a type section to indicate the situation of mounting an electronic parts 41 in a socket 40, a plurality of solder balls 7 is allocated to bellow surface of an electronic part 41, and a plurality of spiral probe 2 is allocated to upper surface of relative socket 40.

FIG. 33(*b*) is a type section to indicate the situation that an electronic part 41 is mounted in a socket 40. In FIG. 33(*b*), A solder probe 7 of an electronic part 41 is held by a guide frame 12 on a socket 40 for positioning and then a spiral probes 2 are pressed for contacting to be fixed by a hook portion of the edge of a damper 42.

FIG. 34 indicates an example of embodiment adopting a spiral probes 2 in an electronic part 43.

FIG. 34(a) is a type section to indicate the situation of mounting an electronic part 43 in a socket 40, a plurality of spiral probe 2 is aligned on the bellow surface of electronic parts 43,and a plurality of solder balls 7 is aligned in a relative socket 40.

FIG. 34(b) is a type section to indicate the situation that an electronic parts 43 is mounted in a socket 40. In FIG. 34(b), a spiral probe 2 of an electronic part 43 is held by a guide frame 12 for positioning, and then a solder ball 7 is pressed by a spiral probe 2 for contacting to be fixed by a hook portion of the edge of a damper 42.

Figure 35:
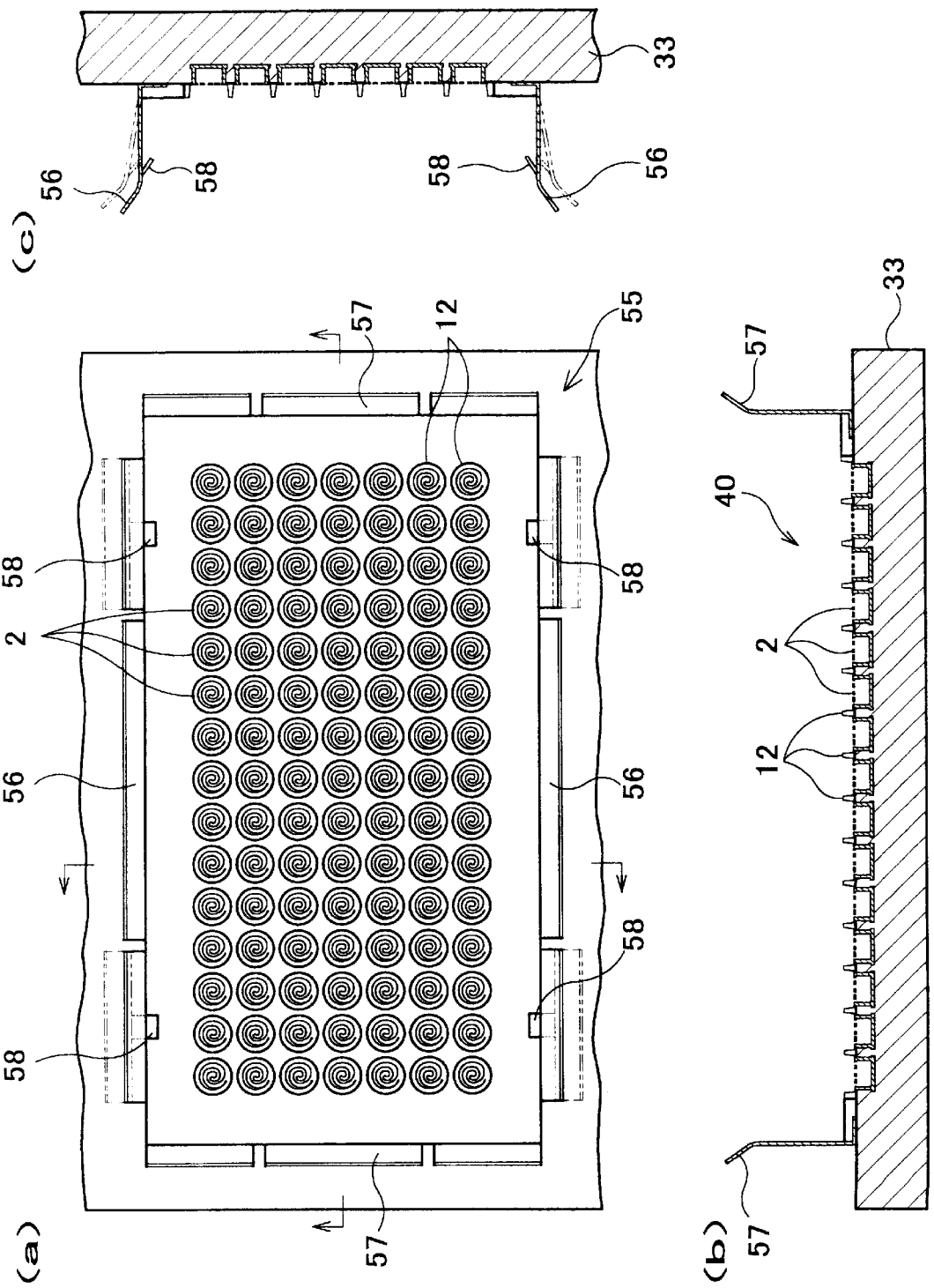
FIG. 35 is a type section to indicate an embodied example of adopting a spiral probe 2 in a socket, (a) is a top view, (b) is a cross sectional front view, and (c) is right side of a cross sectional view.

FIG. 35 is a type section to indicate an example of embodiment adopting a socket 40 in a spiral probes 2 like pervious mention, (a) is a top view, (b) is a front view, (c) is a right side view. As indicating in (b), a socket 40 is embodied in a print wiring board 33 for mounting. As indicating in (a), a spiral probe 2 is systematically allocated to inside of a socket 40, a periphery is surrounded by a socket guide 56,56,57,57, and a socket guide 56,56 is made of an elastic thin SUS plate to be universal for opening and closing. A protruding portion 58,58 is formed in both side of a socket guide 56,56, and it can be easily attached or detached by a special jig (not shown).

Figure 36:
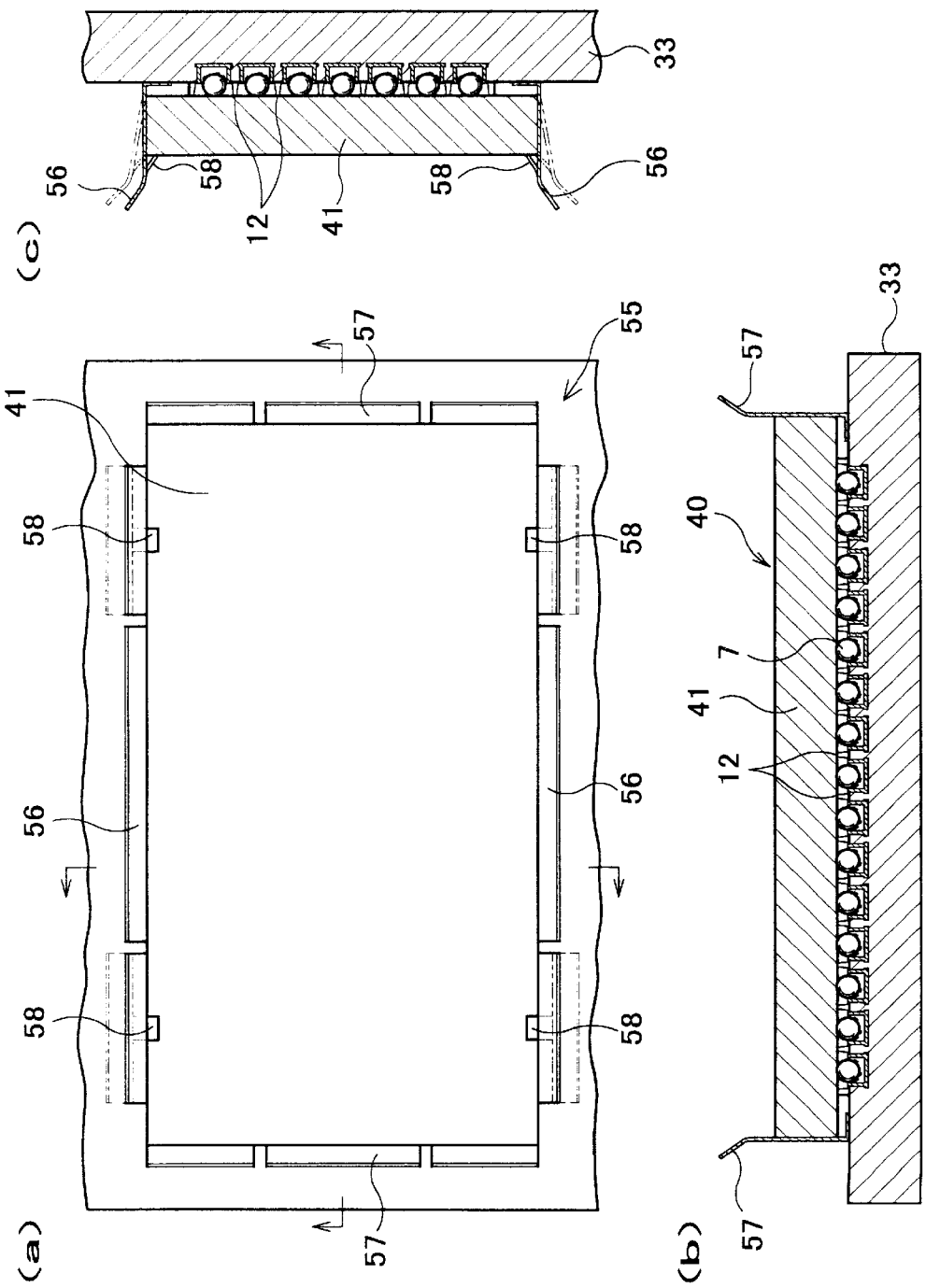
FIG. 36 is a type section to indicate the situation that electronic parts are mounted in a socket, (a) is a top view, (b) is a sectional top view, and (c) is right side of a cross sectional view.

FIG. 36 is a type section to indicate the situation that an electronic part 41 is mounted in a socket 40, (a) is a top view, (b) is a front view, and (c) is a right side view. When mounting, plunging electronic parts as it is causes a socket guide 56 to incline outside for opening as indicating by 2 pointed chain lines, meanwhile, a solder balls 7 of electronic parts 41 is hold and positioned by a guide frame 12 on the socket 40,and is pressed by a spiral probe 2 for contacting to be fixed by a protruding portion 58,58 which is revertible by impetus.

Following is the explanation of an example of the manufacturing method for a spiral contactor 1.

Figure 37:
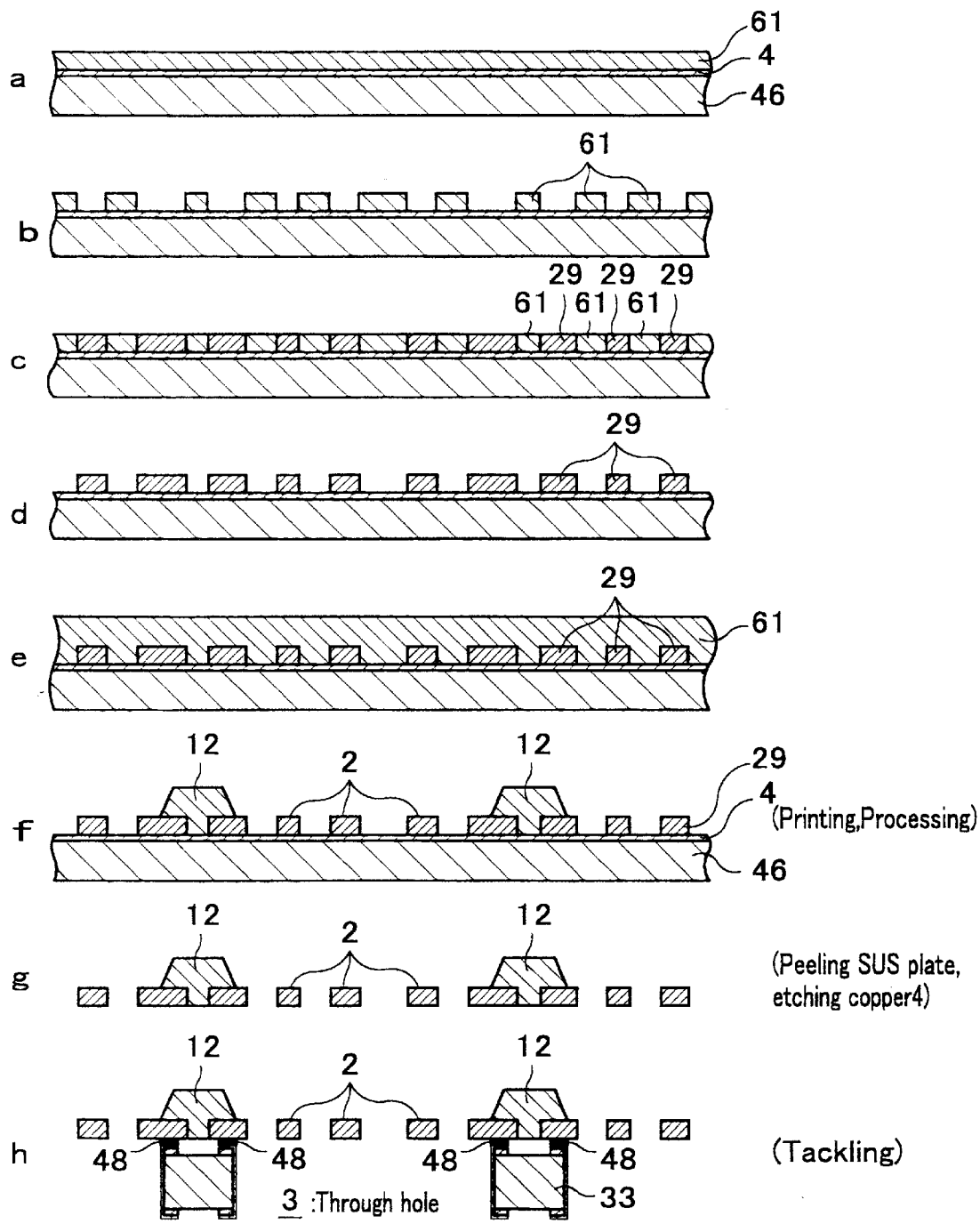
FIG. 37 is a processed diagram to indicate an embodied example that a spiral probe formed on an aluminum plate is transferred and formed on the surface of a print wiring board.

FIG. 37 is a process drawing to indicate an embodiment example to form a spiral probe 2 formed on SUS thin plat 46 by coping on a print wiring board 33. Following is explanation of this manufacturing process.

(a) is a process of dispensing a copper plating 4 on the surface of SUS thin plate 46 to stick a resist membrane film 61 on that surface. This resist membrane film 61 is a dry film, and a photosensitive agent is also acceptable.

(b) is a process of forming a resist membrane film 61 into a concave shape as making a shape of spiral probe 2 a cavity by printing and developing.

(c) is a process of dispensing a nickel plating 29 on the surface of processing (b).

(d) is a process of removing a resist membrane film 61 by a medicine (solvent).

(e) is a process of painting a 50 $\mu$m thick resist membrane film 61.

(f) is a process of forming a guide frame 12 by printing and developing a resist membrane film 61.

(g) is a process of removing a copper plating 4 by etching after peeling and removing SUS thin plate 46.

(h) is a process of painting and tackling a conductive adhesive 48 on the print wiring board 33

Producing a spiral contactor is practical by obeying an aforementioned processing order.

Following is the explanation about and example of the manufacturing method of a spiral contactor 1.

Figure 38:
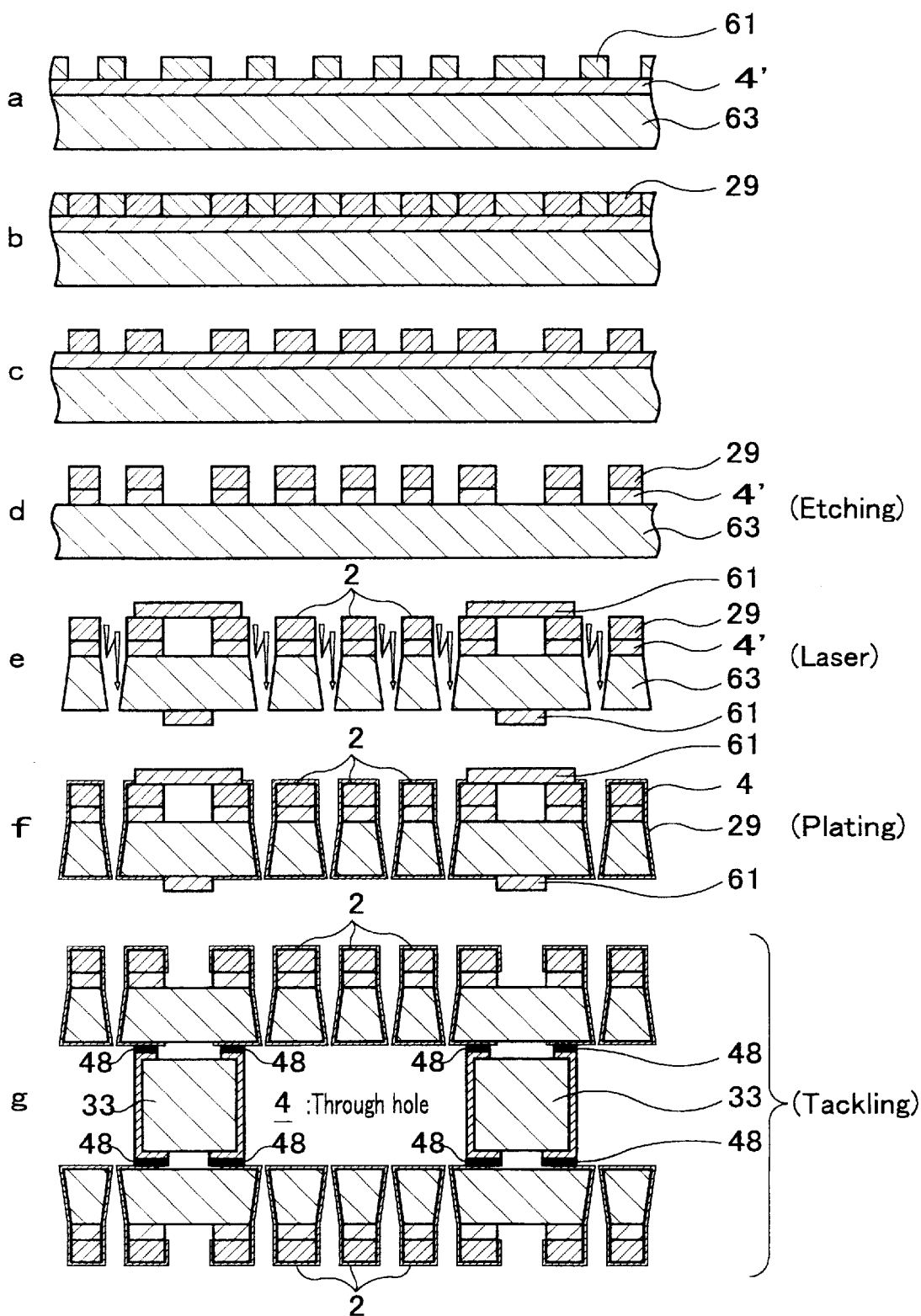
FIG. 38 is a processed diagram to explain the manufacturing method that a spiral contactor is allocated to both side of a print wiring board.

FIG. 38 is a process drawing to explain a manufacturing process that a spiral contactor is allocated to both side of a print wiring board 33. Following is the explanation in accordance with a processing order.

(a) is a process of sticking 18 $\mu$m thick copper foil 4' on upper surface to stick a resist membrane film 61 on upper surface of an insulating substrate 63 which is 0.05 mm thick polyamide. In addition, forming a resist membrane film 61 into a concave shape as making a shape of spiral probe 2 a cavity by printing and developing.

(b) is a process of dispensing a nickel plating 29 by a plating method.

(c) is a process of removing a resist membrane film 61 by a medicine (solvent).

(d) is a process of removing a copper foil 4,by etching.

(e) is a process of forming an insulating substrate 63 of polyamide into a spiral probe 2 by a laser to stick a resist membrane film 61 into only needed area one more time.

(f) is a process of dispensing non electrolytic plating 4 of copper into all surface to dispense a nickel plating 29 on that surface. Secondly, removing a resist membrane film 61 by a medicine (solvent) to complete a spiral contactor having allocated spiral probe 2.

(g) is a process of painting a conductive adhesive 48 on both side of a print wiring board 33 as core to stick and fix a spiral contactor having arraigned spiral probe 2 which is produced in a former process. Besides, if the position of two spiral probes 2 on each side of a print wiring substrate 33 is different, another type for bellow surface can be produced in accordance with the present embodiment. Besides, a paste solder can be used instead of a conductive adhesive 48.

Producing a spiral contactor allocated to both side of a print wiring board 33 is practical by obeying aforementioned process procedure.

Following is another example of the manufacturing method of a spiral contactor 1.

Figure 39:
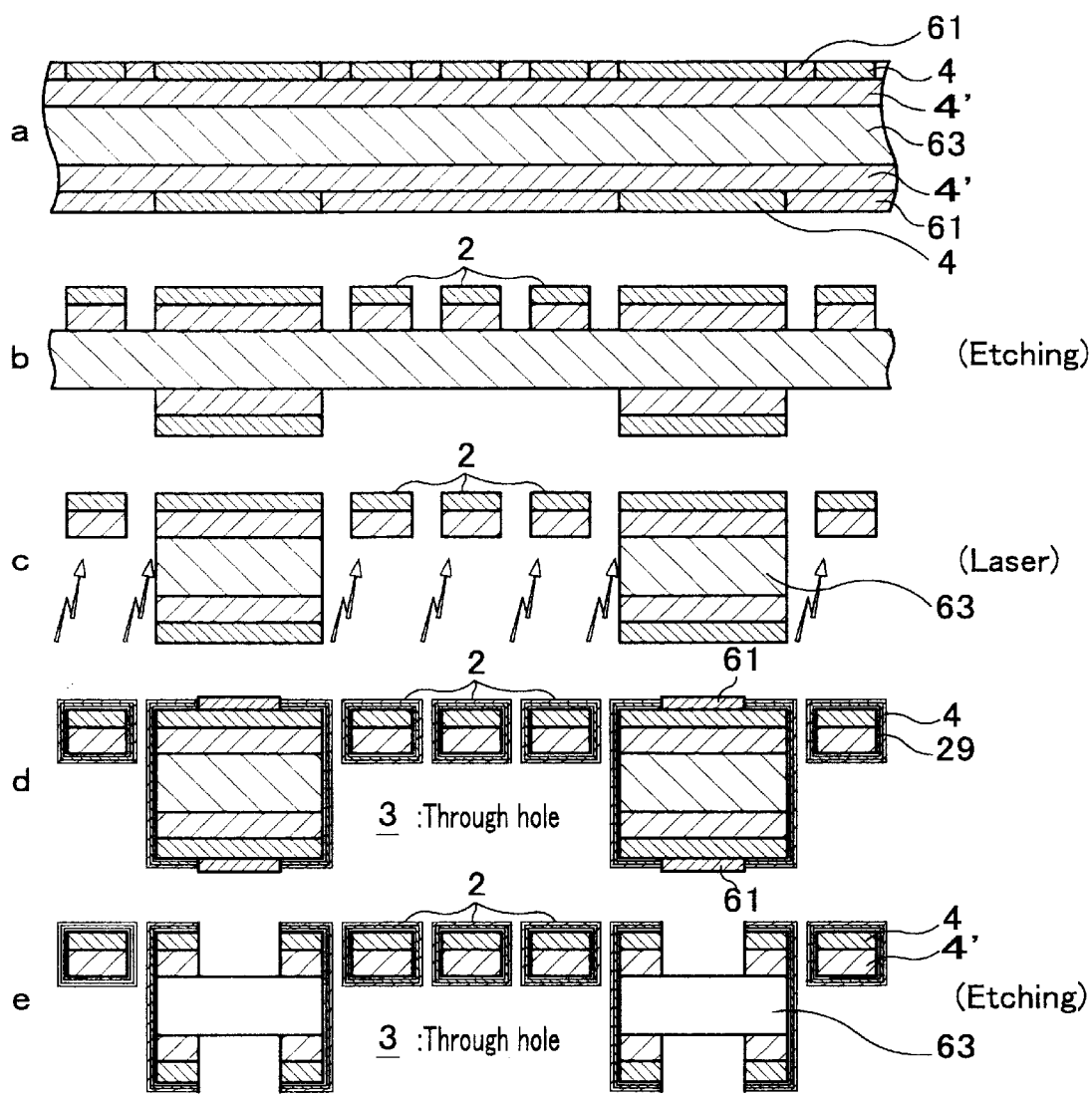
FIG. 39 is a processed diagram to indicate the procedure to make a spiral contactor on an insulating substrate as an embodied example to make a spiral contactor without using a conductive adhesive.

And FIG. 39 is an embodiment example to produce a spiral contactor without a conductive adhesive, and is a process drawing to indicate a procedure to produce a spiral contactor on an insulating substrate 63. Following is an explanation in accordance with a processing order.

(a) is a process of sticking 38 $\mu$m thick copper plate on the surface of an insulating substrate 63 of polyamide in which 18 $\mu$m thick copper foil 4 is stuck on both surface, moreover, producing a shape of spiral probe 2 on resist membrane film 61 by printing and developing after sticking a resist membrane film 61 by thermo compression bonding.

(b) is a process of removing areas except for a shape of a spiral probe 2 by etching.

(c) is a process of removing an insulating substrate 63 of polyamide from bellow surface by laser.

(d) is a process of piling up a nickel plating 29 after sticking a resist membrane film 61 and dispensing electroless copper plating 4 on needed area.

(e) is a process of removing a copper plating 4 by etching after removing a resist membrane film 61.

Producing a spiral contactor having aligned spiral probe 2 on the through hole is practical by obeying aforementioned processing procedure.

Following is the explanation of another example of the manufacturing method of a spiral contactor 1.

Figure 40:
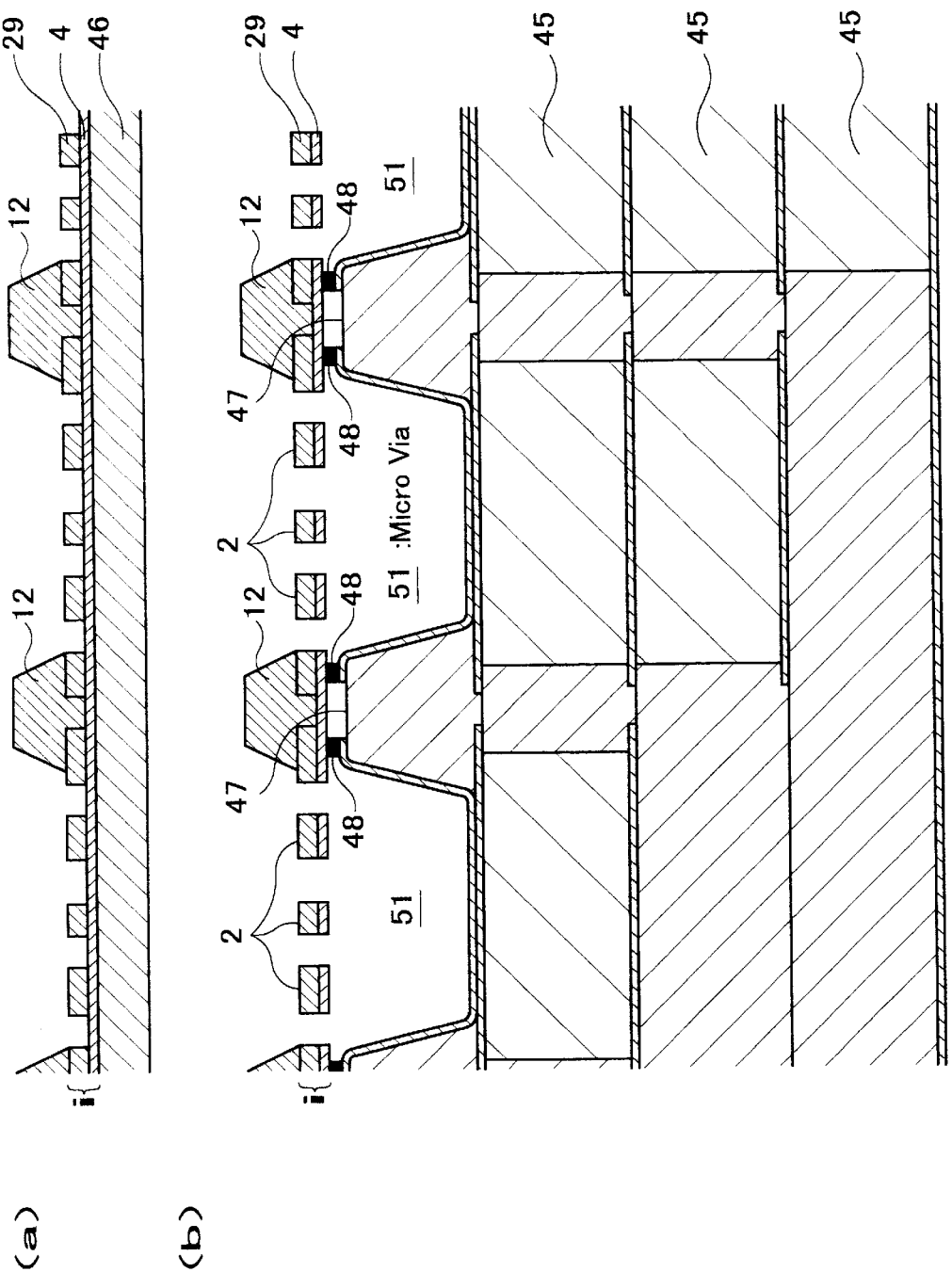
FIG. 40 is a process diagram to indicate an embodied example to provide a spiral contactor in an aperture of micro via formed on the surface of a print wiring board.

FIG. 40 is a process drawing to indicate an embodiment example to provide a spiral probe 2 in an aperture of micro via 51 formed in upper surface 47 of print wiring board 45. Micro via 51 is a connecting circuit to connect an interlayer of a print wiring board 45, 45, 45 as improved multi layer structure. In the embodiment example, providing a spiral probe 2 in an aperture of a micro via 51 causes usage both a micro bear 51 and through hole to be practical which leads more thin plate.

Following is an explanation of this manufacturing process.

(a) is a process of peeling SUS plate 46 to remove away, and then removing a copper foil 4' by etching after producing in the same process (a)~(f) of said FIG. 37.

(b) is a process that a spiral probe 2 can be provided on an aperture of a micro bear 51 as showing in FIG. 40 by painting and fixing a conductive adhesive 48 on the surface 47 of micro via 51.

Like an aforesaid, According to the present invention, materializing various effects in following mention can be practical. According to the invention, the effect of a spiral contactor is:

(1) long contacting point compared with a conventional method due to a spiral probing, and hardly affected with contact failure by adhering foreign matters due to many contacting parts, consequently materializing a high reliable inspection equipment is practical.

(2) able to deform in response to the shape of a solder ball for contacting with winding around, therefore this does not cause damage such as flaw or deformation to solder balls.

(3) able to secure accuracy contact since a dispersion in diameter or position of solder balls does not affect winding.

(4) advantage for high frequency signal since a length from a semiconductor device to a package can be shorten.

(5) excellent in space efficiency and able to compatible with high density solder probe by allocating a spiral probe to an aperture commonly called as through hole.

(6) possible to compatible with improving densification of mounting for even one socket as one of inspecting equipment.

Following is an arrangement of aforementioned effect.

a. A chip sized socket applied for a bear chip is practical.

b. Densification of a socket equivalent to chip tray's one is practical.

c. A possibility of improving socket density to the same level of tray's one allows a socket to pluralize, consequently this leads effective cost reduction.

d. Barn in board of dense and high space efficiency is practical.

e. Transmitting chips from tip tray directory to barn in board is practical, consequently working efficiency is significantly improved.

According to the invention, sufficient deformation is practical by a dent under a spiral probe or a space of established hole.

According to the invention, since wiring space can be minimized by forming a current-carry circuit of a perpendicular wiring system, responding to densification of solder probe is practical.

According to the invention, since a spiral contactor can respond to a sudden voltage drop of power source in a rapid signal processing circuit by placing one or a plurality of condenser around a spiral probe for connecting with a spiral probe, transmission trouble of electric signals can be prevented in advance, consequently a reliability of inspection device can be improved.

According to the invention, either filling elastic bodies into dents or holes or dispensing an elastic membrane over holes of aperture can prevent a spiral contactor from sinking, and can aid a spiral contactor with restoration after releasing a presser of a solder ball to improve durability and to secure air tight.

According to the invention, a spiral probe can disperse a bending stress to maintain a durability and a long life span by making a width thinner as approaching top from root.

According to the invention, installing a guide frame helps a solder ball to sink into aperture of guide frame and help each spiral probe for positioning, consequently shortening time for loading is practical. Furthermore, upper surface of a guide frame plays a role of stopper to restrict an indention of ball, consequently maintaining a long life span of a spiral probe is practical.

According to the invention, the present invention regarding to concave shaped spiral probe can lead optimal contact for a solder probe having a flat plane such as a shape of bounding pat due to a combination of a flat plane and a sphericity.

According to the invention, adopting sensors allows knowing the situation as picking up an error information in advance whether a package of a semiconductor device is loaded in a proper position of socket or not, this improves reliability for atomization.

According to the invention, dispensing a sealant in between an inspection device (socket) and device under inspection (such as package) to evacuate air inside of both can lead a vacuum adsorption process, this process can eliminate pressing parts as well as an operation for assembling parts to reduce loading times. And this technology can cause atomization.

According to the invention, detecting a decrease of air pressure (fluctuation) caused by evacuating air in between an insulating substrate and a semiconductor device through a pressure sensor, this improve reliability for atomization.

According to the invention, in the inspection of wafer chip, permitting the inspection (probing) after dicing to carry out can reduce a conventional inspecting time from twice to once, this permits a man-hour for inspection to reduce by half.

According to the invention, when a spiral contactor is broken or replacement is required due to alternative contact, replacing only portion of a spiral contactor is sufficient which causes a local and easy removal for suitable maintenance.

According to the invention, alternative contact system for a spiral contactor can produce a miniature, maximum thinning dawn and lightening electronic parts which leads an excellent high frequency electric characteristics and a practical high densification mounting.

Moreover, connecting is simple and easy, and price is low due to few numbers of parts.

According to the invention, like above mention, a miniature, maximum thinning dawn and lightening electronic parts can be produced which causes an excellent high frequency electric characteristics and a practical high densification mounting through a spiral contactors.

Moreover, connecting is simple and easy, and price is low due to few numbers of parts.

According to the invention, since a spiral contactor in which a plurality of spiral probe aligned sophisticatedly, densely and in fine pitch can be produced on a print wiring board by the manufacturing method adopting photolithography technology, this case henceforth is applicable to a sophistication, a densification and a fine pitch. Furthermore, manufacturing cost can be reduced due to light, thin and minimum one.

According to the invention, since a guide frame can be formed by a resist membrane, this allows a shape to maintain without solution for falling into pieces even through a metal plate is peeled, consequently, quality is improved. And a spiral contactor in which a plurality of spiral probe aligned sophisticatedly, densely and in fine pitch can be produced on a print wiring board having through holes by the manufacturing method adopting photolithography technology, this case henceforth is applicable to a sophistication, a densification and a fine pitch. Furthermore, manufacturing cost can be reduced due to light, thin and minimum one.

According to the invention, since a metal portion as it is can be left by irradiating a laser to an insulating substrate consists of a polyamide, the shape of a spiral probe can be formed. Furthermore, a spiral contactor in which a plurality of spiral probe aligned sophisticatedly, densely and in fine pitch can be produced on both surface of a print wiring substrate having through holes by the manufacturing method adopting photolithography technology, this case henceforth is applicable to a sophistication, a densification and a fine pitch. Besides, a manufacturing cost can be reduced due to light, thin and minimum one.

According to the invention, since a spiral contactor in which a plurality of spiral probe aligned can be produced on even a print wiring substrate having through holes by the manufacturing method of not using a conductive agent or hander paste, and a spiral contactor in which a plurality of aligned spiral probe sophisticatedly, densely and in fine pitch can be produced by the manufacturing method adopting photolithography technology, this case henceforth is applicable to a sophistication, a densification and in fine pitch. Besides, a manufacturing cost can be reduced due to light, thin and minimum one.

According to the invention, since a spiral contactor in which a plurality of spiral probe aligned can be produced on even a print wiring substrate having micro via holes by this manufacturing method, and a spiral contactor in which a plurality of aligned spiral probe sophisticatedly, densely and in fine pitch can be produced by the manufacturing method adopting photolithography technology, this case henceforth is applicable to a sophistication, a densification and in fine pitch. Besides, a manufacturing cost can be reduced due to light, thin and minimum one.

What is claimed is:

1. A spiral contactor for establishing an electrical connection with a semiconductor device or electric part including a solder ball, the spiral contactor comprising:
    an insulating substrate; and
    a spiral probe contacting the solder ball, said spiral probe including a single spiral inwardly extending cantilevered portion having a spiral shape as viewed from a top thereof, the spirally extending cantilevered portion having a fixed proximal end and a free distal end,
    wherein the spiral probe is embedded in the insulating substrate in a manner that permits resilient deformation thereof in accordance with a shape of the solder ball; and
    wherein the spiral probe has an acute edge which is pressed so as to engage into the solder ball and slides along a periphery of the solder ball, thereby cutting oxide membrane thereon.

2. A spiral contactor according to claim 1, wherein at least one capacitor is embedded in a through hole provided in the insulating substrate and around the spiral probe, said at least one capacitor is electrically connected with the spiral probe.

3. A spiral contactor according to claim 1, wherein the insulating substrate is provided with any one of an elastic body and an elastic membrane in a position under the spiral probe so that space between the solder ball and the spiral probe is hermetically sealed.

4. A spiral contactor according to claim 1, wherein the spiral cantilevered portion of the spiral probe has a tapering width that gradually narrows from the proximal end of the spiral portion to a distal end thereof.

5. A spiral contactor according to claim 1, wherein the solder ball is in the form of a bonding pad; and
    wherein the spiral probe has a convex shape as viewed from a side thereof.

6. A semiconductor device inspecting apparatus comprising a spiral contactor according to claim 1, wherein the spiral contactor is disposed on both sides of the insulating substrate.

7. An electronic part including a spiral contactor according to claim 1, wherein the spiral contactor is disposed on at least one side of the insulating substrate.

8. An electronic part including:
    a spiral contactor according to claim 1; and
    a connector cable,
    wherein the spiral contactor is provided at at least one end of the connector cable.

9. A spiral contactor according to claim 1, wherein the insulating substrate includes one of a depression and a through hole that enables the resilient deformation of the spiral probe disposed so as to cover an opening thereof.

10. A spiral contactor according to claim 9, wherein a vertically wired electric circuit is provided on an inner surface of one of the depression and the through hole.

11. A semiconductor device inspecting apparatus comprising:
    a spiral contactor according to claim 1; and
    a sensor that determines whether the semiconductor device to be inspected is loaded in a normal position within the semiconductor device inspecting apparatus and whether the spiral probe contacts the solder ball of the semiconductor device with a proper stress.

12. A semiconductor device inspecting apparatus according to claim 11, further comprising a sealant that is provided on the insulating substrate and seals contact surfaces of the insulating substrate and the semiconductor device.

13. A semiconductor device inspecting apparatus according to claim 12, further comprising an air pressure detector that detects decrease of air pressure caused by sucking air between the insulating substrate and the semiconductor device, and transmits a signal indicating that the semiconductor device is adsorbed.

14. A spiral contactor according to claim 1, including a plurality of the spiral probes spaced from each other at regular intervals and connected with each other through a guide frame provided on the insulating substrate around the spiral probe wherein the guide frame guides and aligns the solder ball and prevents the solder ball from being pushed down excessively, the plurality of the spiral probes being electrically insulated from each other with the guide frame.

15. A semiconductor device inspecting apparatus comprising:
    a spiral contactor according to claim 14; and
    a probe card in which a plurality of the spiral probes are arranged in accordance with a position of each solder ball,
    wherein each semiconductor device is properly aligned with the corresponding spiral probe using the guide frame, even after a wafer of the semiconductor device is diced by a dicer.

* * * * *